(12) United States Patent
Sugizaki et al.

(10) Patent No.: US 9,029,892 B2
(45) Date of Patent: May 12, 2015

(54) DEVICE MODULE

(71) Applicant: Kabushiki Kaisha Toshiba, Minato-ku, Tokyo (JP)

(72) Inventors: Yoshiaki Sugizaki, Kanagawa-ken (JP); Hideto Furuyama, Kanagawa-ken (JP); Akihiro Kojima, Kanagawa-ken (JP); Miyoko Shimada, Kanagawa-ken (JP); Yosuke Akimoto, Kanagawa-ken (JP); Hideyuki Tomizawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/784,778

(22) Filed: Mar. 4, 2013

(65) Prior Publication Data
US 2013/0320371 A1   Dec. 5, 2013

(30) Foreign Application Priority Data
Jun. 4, 2012   (JP) ................. 2012-127102

(51) Int. Cl.
*H01L 33/62*   (2010.01)
*H01L 33/50*   (2010.01)
(Continued)

(52) U.S. Cl.
CPC ............ *H01L 33/62* (2013.01); *H01L 33/50* (2013.01); *H05K 1/111* (2013.01); *H05K 3/3431* (2013.01); *H05K 2201/10106* (2013.01); *H01L 24/32* (2013.01); *H01L 2924/12041* (2013.01)

(58) Field of Classification Search
CPC ........... H01L 2924/00013; H01L 2924/00012; H01L 2224/13099; H01L 2224/05552; H01L 2224/05555; H01L 2924/00014; H01L 2924/014; H01L 33/0079; H01L 33/38; H01L 33/44; H01L 33/486; H01L 24/02; H01L 24/05; H01L 24/13; H01L 24/12; H01L 24/81
USPC ....................................... 257/98–99
See application file for complete search history.

(56) References Cited

U.S. PATENT DOCUMENTS 7,193,247 B2 *  3/2007  Tsuchiya et al. ................ 257/99
8,110,421 B2    2/2012  Sugizaki et al.
(Continued)

FOREIGN PATENT DOCUMENTS

EP   1026927 A2   8/2000
EP   2369642 A1   9/2011
(Continued)

OTHER PUBLICATIONS

Extended European Search Report (EESR) dated Jul. 7, 2014 issued in counterpart European Application No. 13157778.5.

*Primary Examiner* — David Vu
*Assistant Examiner* — Jonathan Han
(74) *Attorney, Agent, or Firm* — Holtz, Holtz, Goodman & Chick PC

(57) ABSTRACT

According to one embodiment, a device module includes a mounting substrate, a device, and a bonding agent. The mounting substrate has a mounting surface and a plurality of pads. The device includes a plurality of electrode surfaces arranged in a first direction. The pad has a first width portion and a second width portion. The first width portion has a width in a second direction orthogonal to the first direction. The second width portion is wider than the first width portion and the electrode surfaces in the second direction. One end portion in the first direction of the electrode surface is bonded to the pad on the first width portion via the bonding agent. The other end portion in the first direction of the electrode surface is bonded to the pad on the second width portion via the bonding agent.

23 Claims, 21 Drawing Sheets

(51) Int. Cl.
*H05K 1/11* (2006.01)
*H05K 3/34* (2006.01)
*H01L 23/00* (2006.01)

(56) References Cited

U.S. PATENT DOCUMENTS

2004/0195579 A1* 10/2004 Sonobe .......................... 257/99
2009/0159902 A1* 6/2009 Yasuda et al. .................. 257/88
2009/0314535 A1* 12/2009 Kusumoto .................... 174/260
2010/0148198 A1* 6/2010 Sugizaki et al. ................ 257/98
2011/0233586 A1 9/2011 Kojima et al.

FOREIGN PATENT DOCUMENTS

| JP | 09199841 A | 7/1997 |
| JP | 2003234567 A | 8/2003 |

* cited by examiner

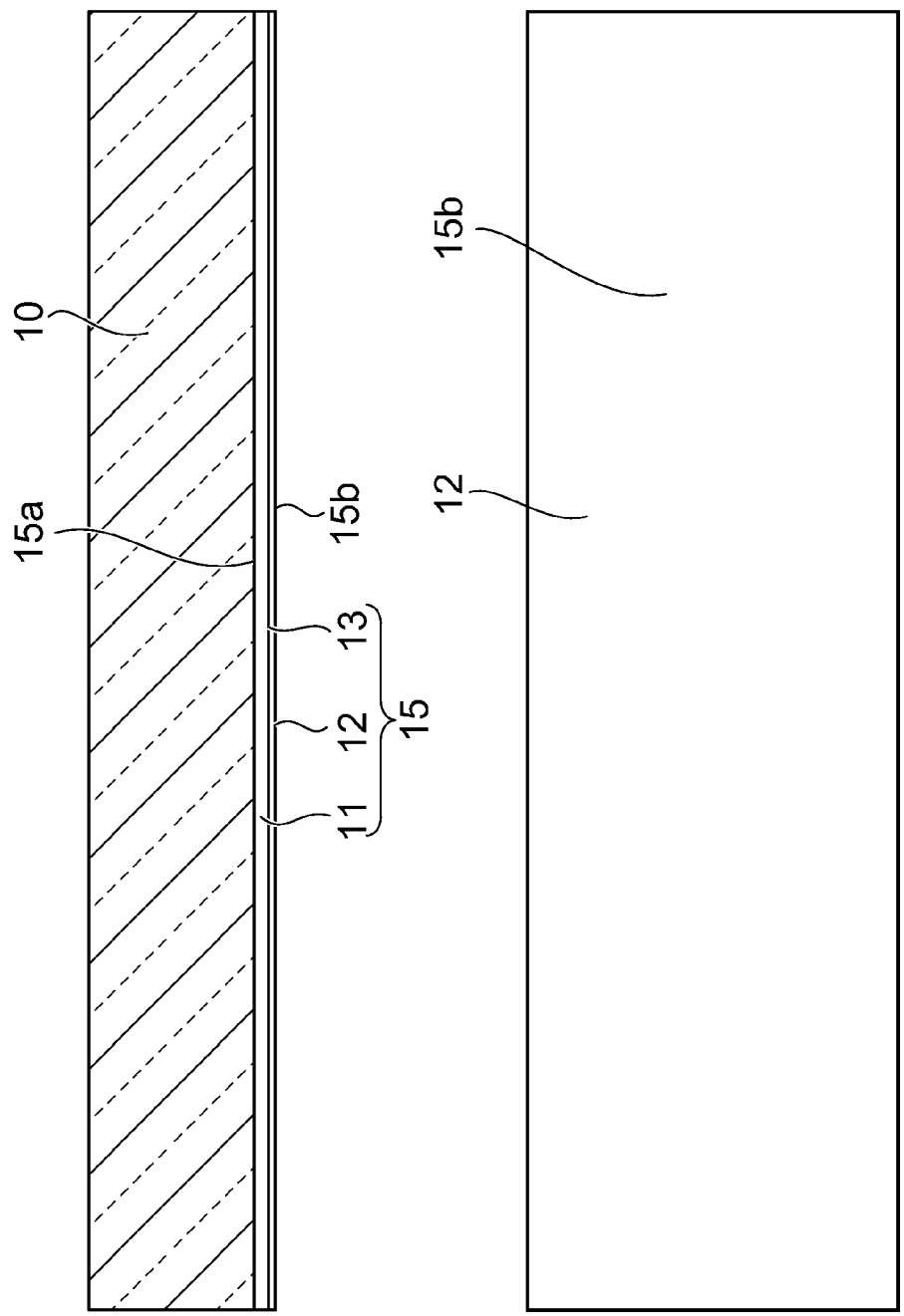

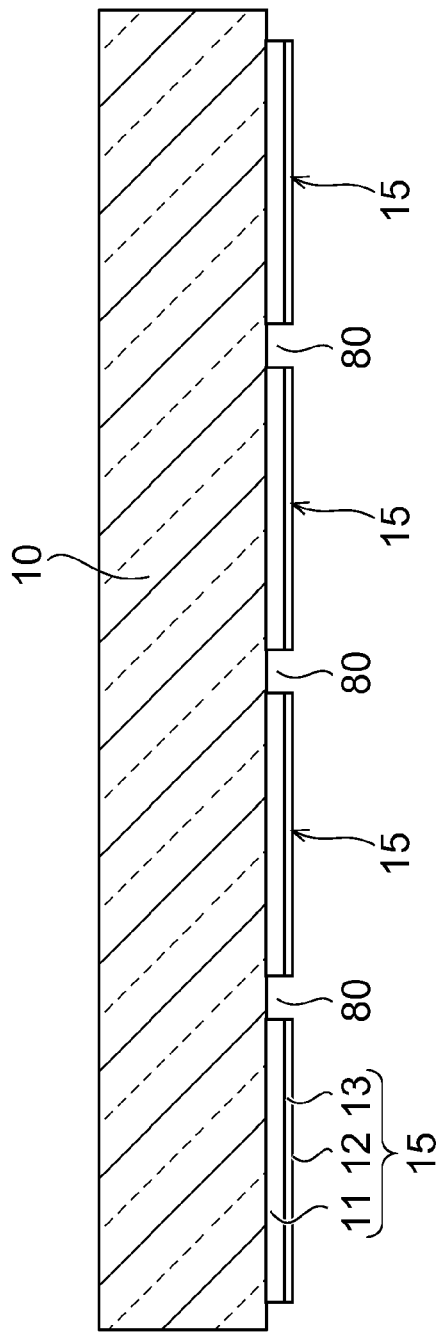
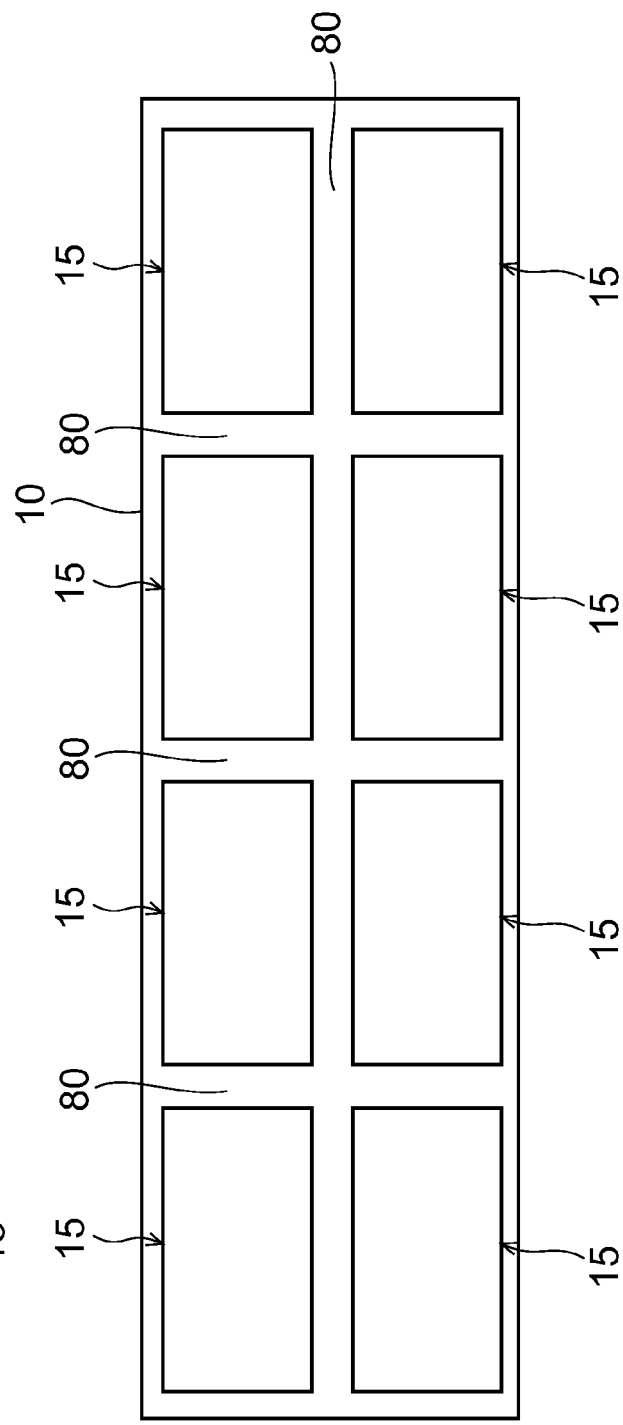
FIG. 10A
FIG. 10B

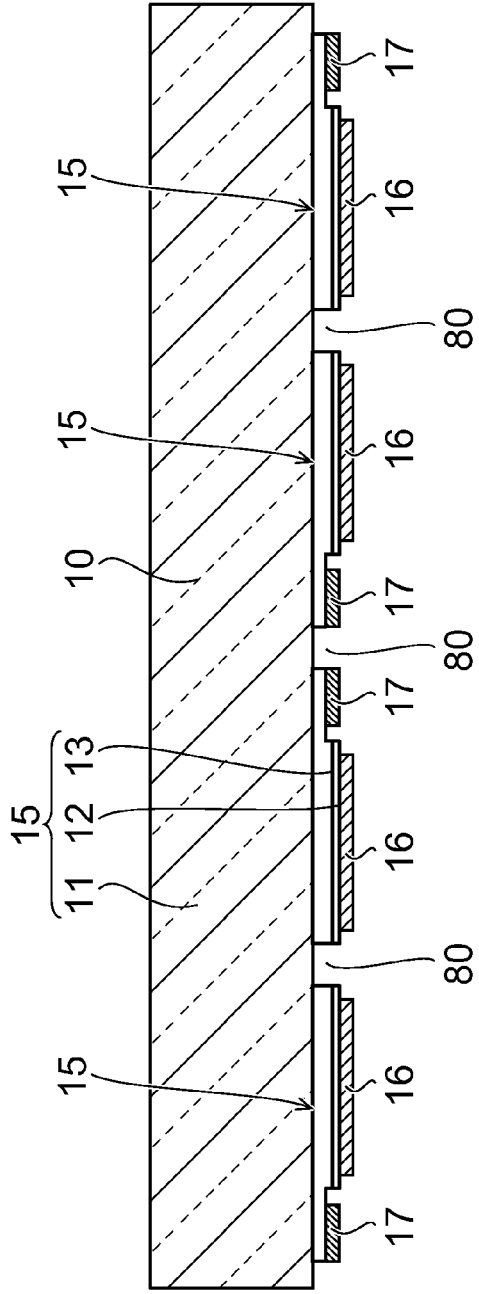
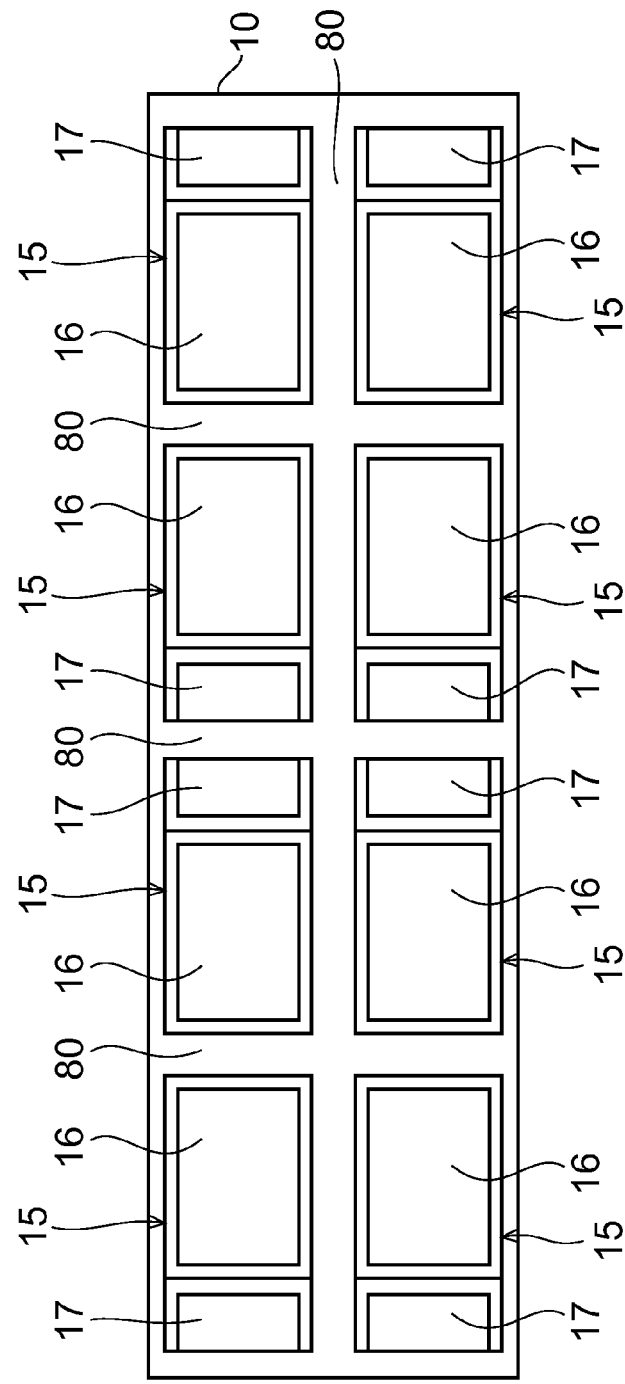

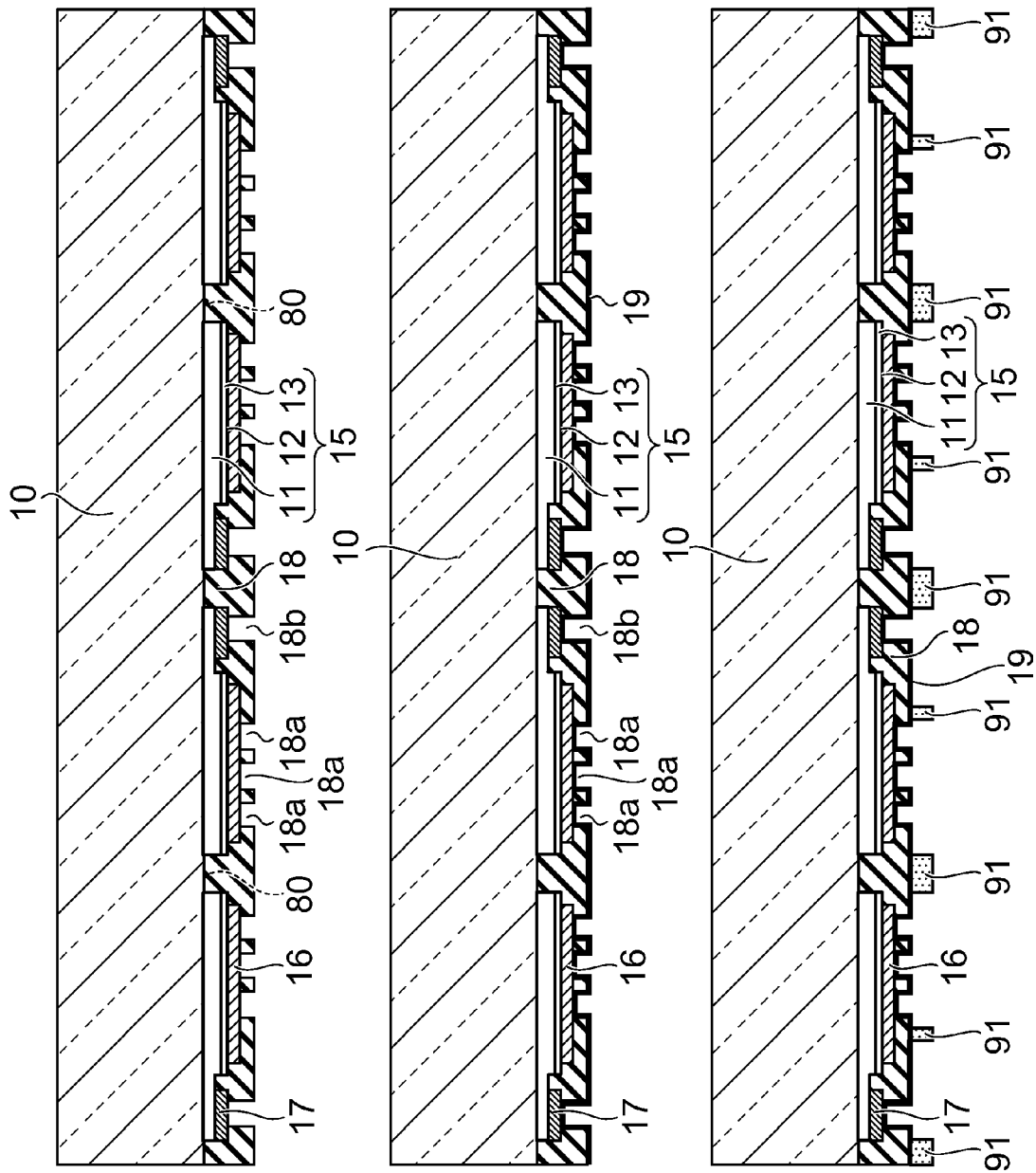

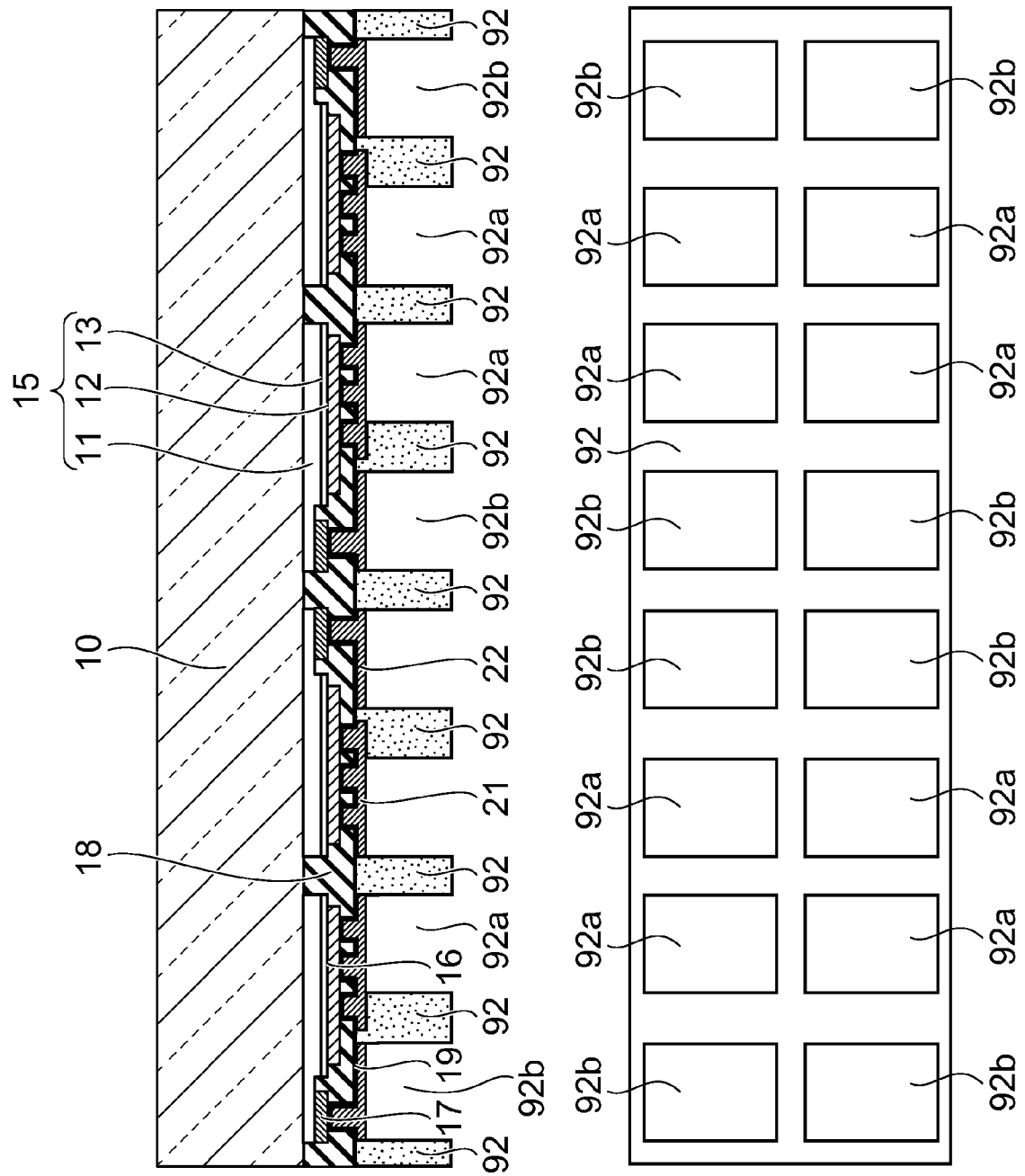

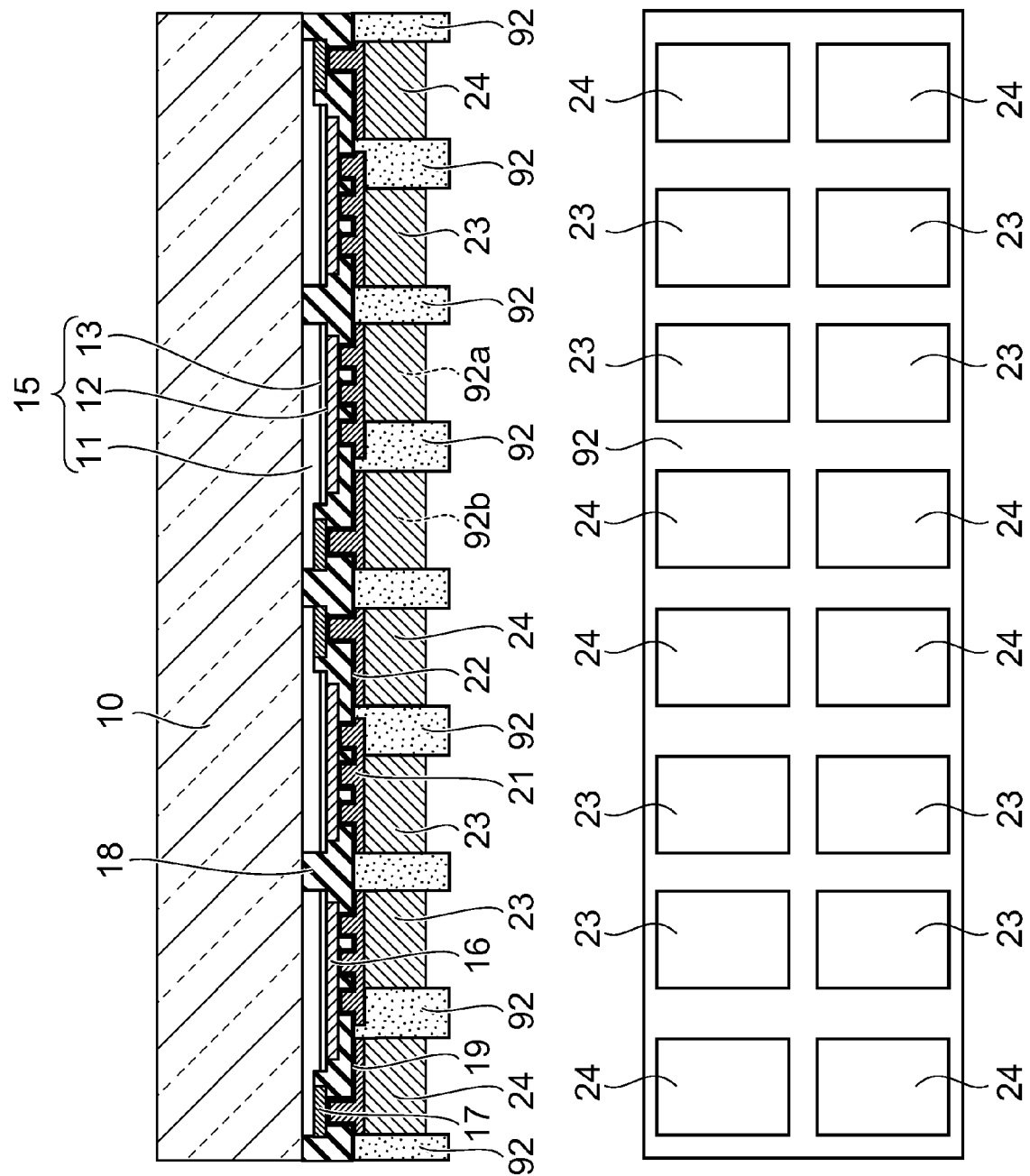

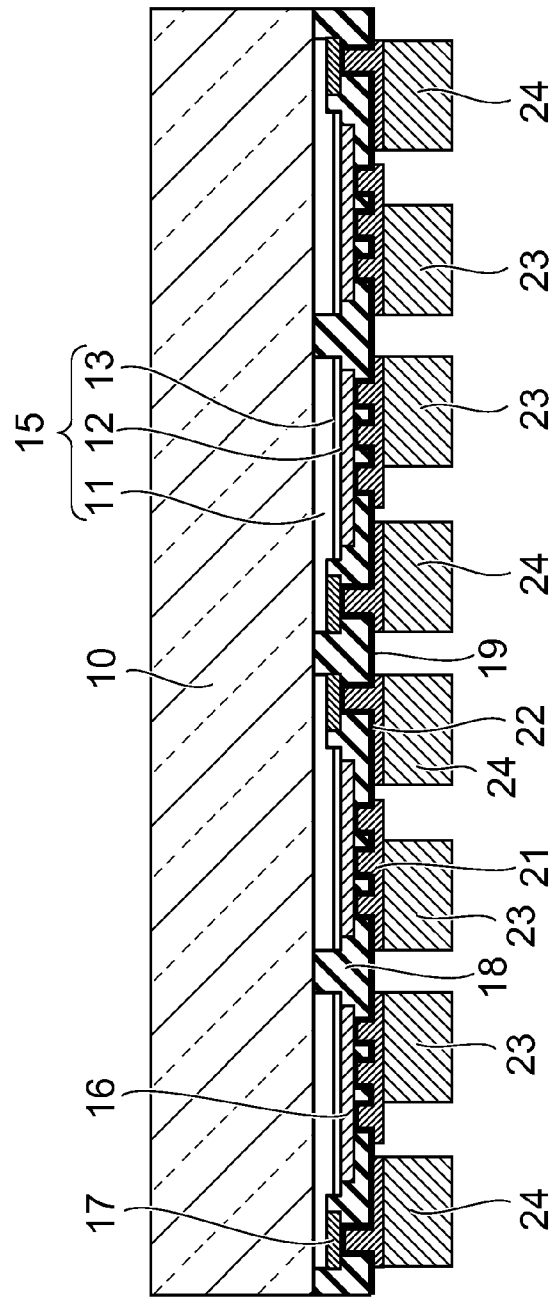
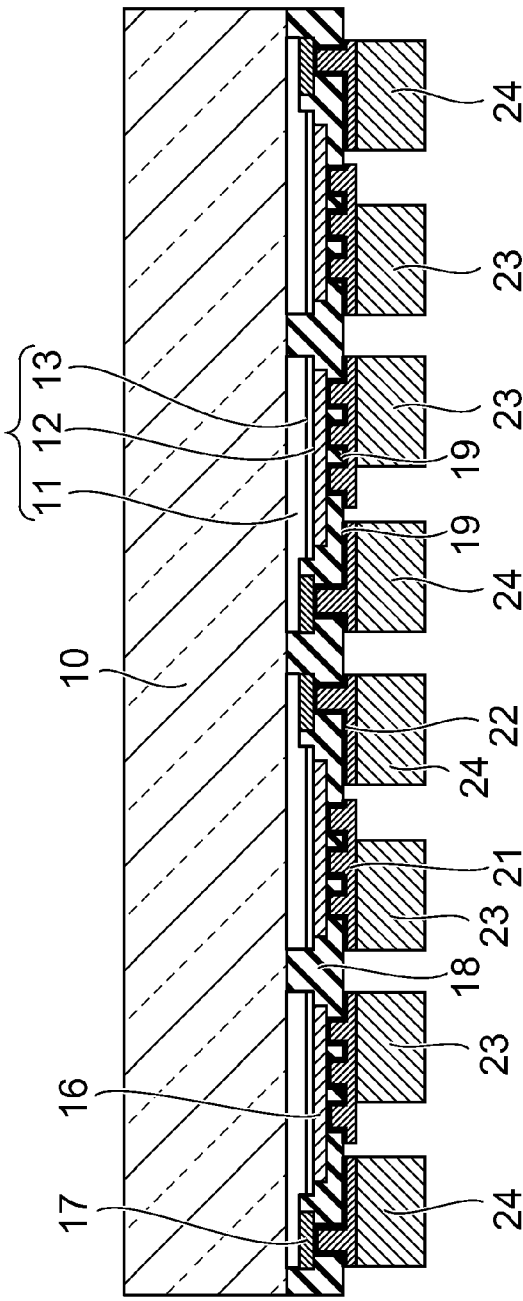
FIG. 17A
FIG. 17B

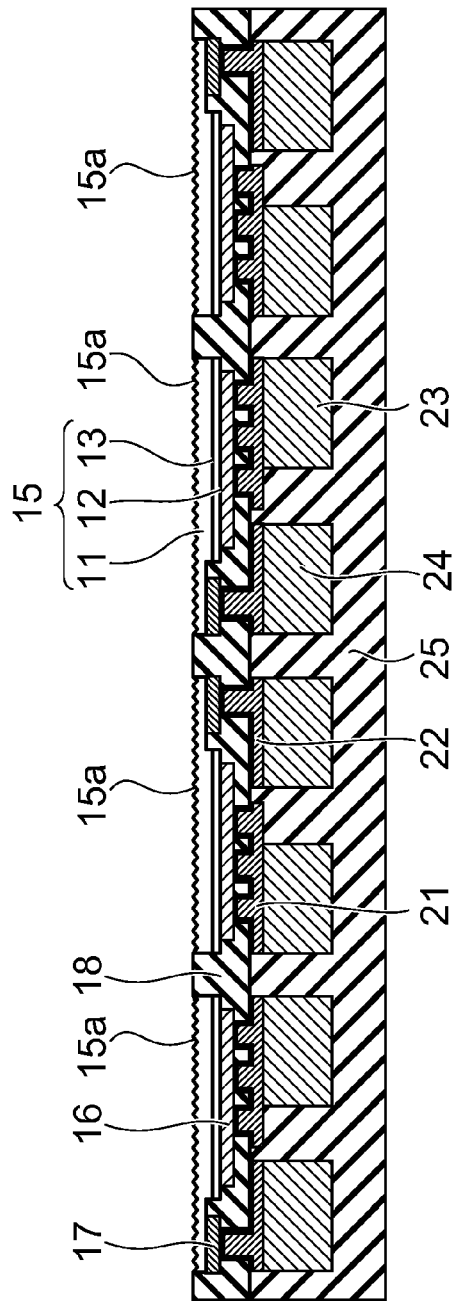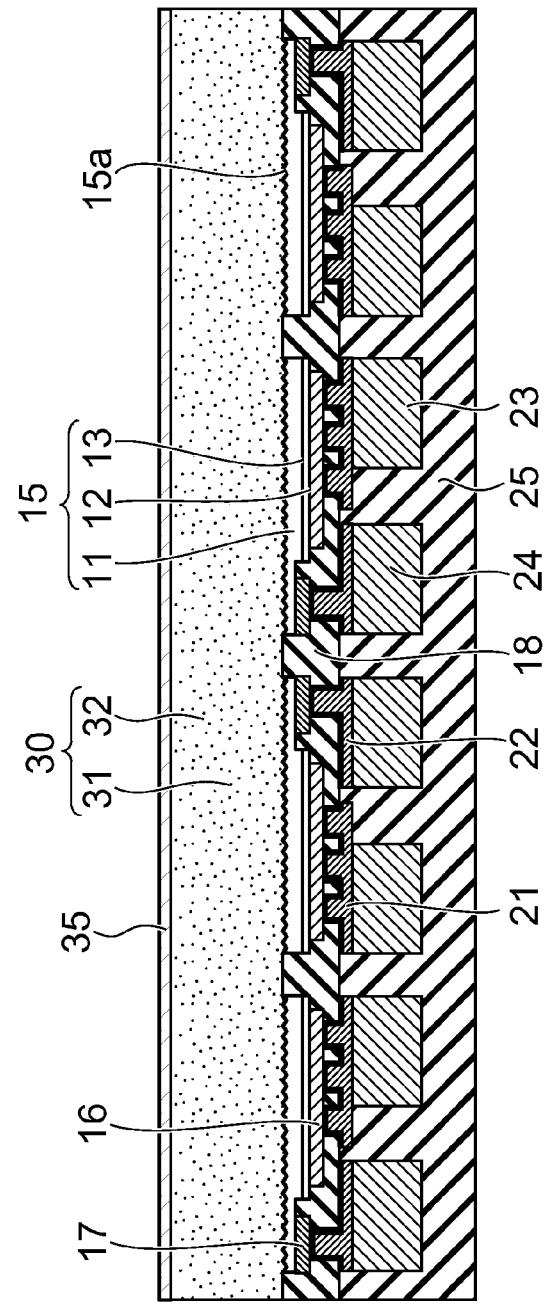
FIG. 19A
FIG. 19B

DEVICE MODULE

CROSS-REFERENCE TO RELATED APPLICATION

This application is based upon and claims the benefit of priority from Japanese Patent Application No. 2012-127102, filed on Jun. 4, 2012; the entire contents of which are incorporated herein by reference.

FIELD

Embodiments described herein relate generally to a device module.

BACKGROUND

Surface mount technology is known in which a chip such as, for example, an LED (Light Emitting Diode), etc., is mounted on a mounting substrate via solder by reflow. In such surface mount technology, there are cases where tilting of the chip in the reflow is problematic.

BRIEF DESCRIPTION OF THE DRAWINGS

FIG. 9A to FIG. 20B are schematic views showing a method for manufacturing the device of the fifth embodiment.

DETAILED DESCRIPTION

Figure 1A:
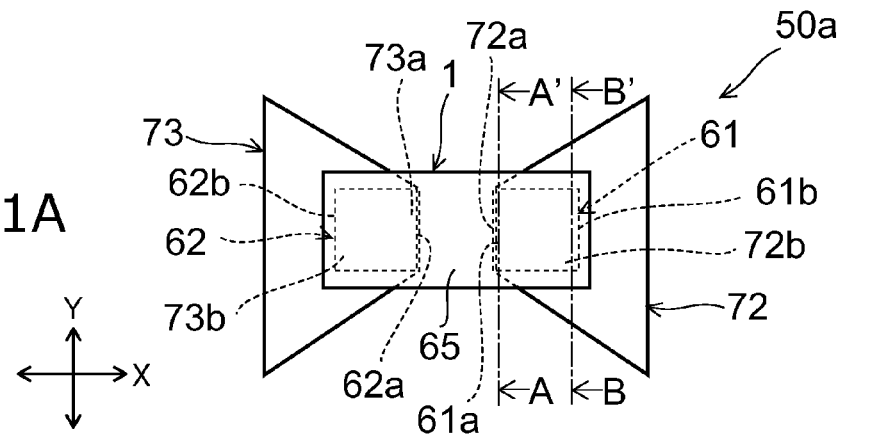
FIGS. 1A to 1C are schematic views of a device module of a first embodiment.

According to one embodiment, a device module includes a mounting substrate, a device, and a bonding agent. The mounting substrate has a mounting surface and a plurality of pads provided in the mounting surface. The device includes a plurality of electrode surfaces arranged in a first direction. The device is mounted on the mounting substrate with the electrode surfaces oriented toward the mounting surface. The bonding agent is provided between the pads and the electrode surfaces. The bonding agent is conductive. The pad has a first width portion and a second width portion. The first width portion has a width in a second direction orthogonal to the first direction. The second width portion is wider than the first width portion and the electrode surfaces in the second direction. One end portion in the first direction of the electrode surface is bonded to the pad on the first width portion via the bonding agent. The other end portion in the first direction of the electrode surface is bonded to the pad on the second width portion via the bonding agent.

Embodiments will now be described with reference to the drawings. Similar components in the drawings are marked with like reference numerals.

First Embodiment

Figure 1B:
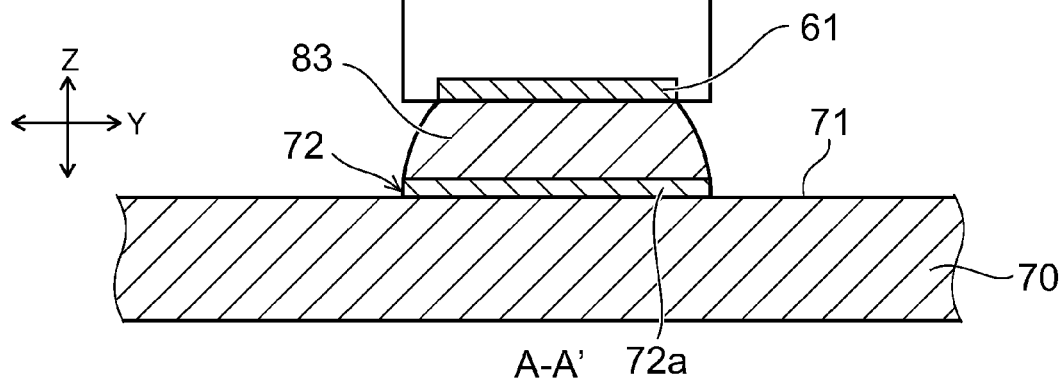
Figure 1C:
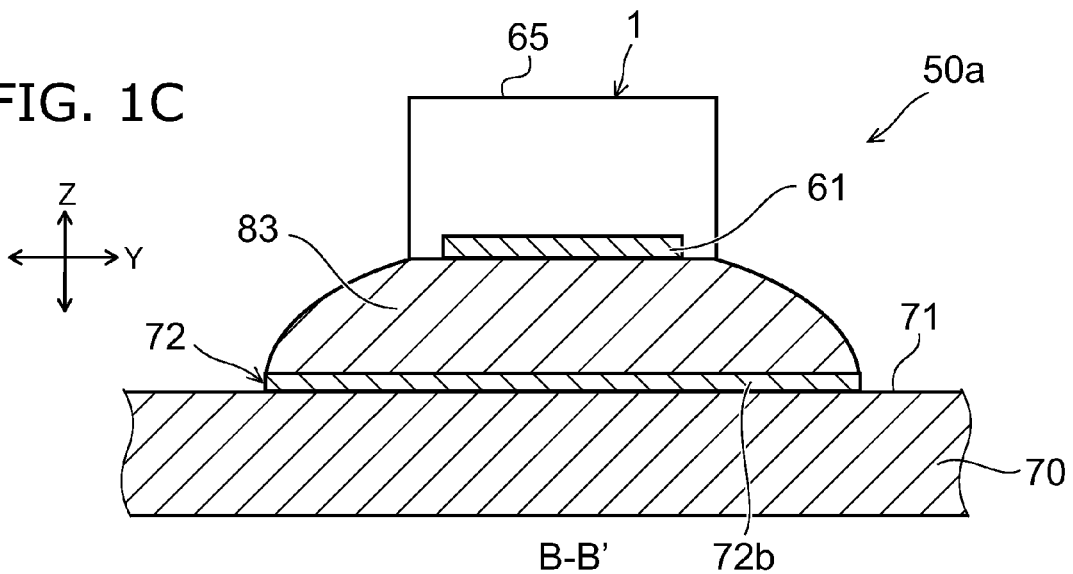

FIG. 1A is a schematic top view of a device module 50a of a first embodiment.
FIG. 1B is the A-A' enlarged cross-sectional view of FIG. 1A.
FIG. 1C is the B-B' enlarged cross-sectional view of FIG. 1A.

The device module 50a includes a mounting substrate 70 and a device 1 mounted on the mounting substrate 70.

The mounting substrate 70 includes, for example, a substrate having a resin substrate or a ceramic substrate as a base, multiple pads 72 and 73 provided in a mounting surface 71 which is one surface of the substrate, and an interconnect pattern (not shown) provided in the mounting surface 71 and connected to the pads 72 and 73.

Or, a metal plate having excellent heat dissipation may be used as the base substrate of the mounting substrate 70. In such a case, an insulating film is provided on the metal plate; and the pads 72 and 73 and the interconnect pattern are formed on the insulating film.

The device 1 to be mounted is an electronic device or an optical device having a chip configuration. For example, the device 1 is a resistance device, a capacitor device, a diode device, a light emitting device, a light receiving device, etc.

The exterior form of the device 1 is formed in, for example, a rectangular parallelepiped configuration; and the device 1 has an upper surface 65 having a rectangular configuration. A pair of electrode surfaces 61 and 62 is formed in the lower surface on the side opposite to the upper surface 65. The electrode surfaces 61 and 62 are exposed at the lower surface of the device 1.

In the top view of FIG. 1A as viewed from the upper surface of the device 1, the longitudinal direction (of the upper surface 65) of the device 1 is taken as an X direction (a first direction); and a direction orthogonal to the X direction is taken as a Y direction (a second direction). In the cross-sectional views of FIGS. 1B and 1C, a direction orthogonal to the X direction and the Y direction and perpendicular to the mounting surface 71 of the mounting substrate 70 is taken as a Z direction (a third direction).

The pair of electrode surfaces 61 and 62 is arranged in the X direction. The pair of electrode surfaces 61 and 62 is formed in the same rectangular or square configuration with the same surface area. The pair of electrode surfaces 61 and 62 is formed with line symmetry with respect to a longitudinal-direction bisector of the device 1. The device 1 is mounted on the mounting substrate 70 with the electrode surfaces 61 and 62 oriented toward the mounting surface 71.

The device 1 mounted on the mounting substrate 70 is not limited to one device; and multiple devices 1 may be mounted on the mounting substrate 70.

The pair of pads 72 and 73 is formed in the mounting surface 71 of the mounting substrate 70 to correspond to the pair of electrode surfaces 61 and 62 of the device 1. In the case where multiple devices 1 are mounted on the mounting substrate 70, multiple pairs of pads 72 and 73 are formed in the mounting surface 71. The planar configuration of each of the pads 72 and 73 is formed in a trapezoidal configuration as shown in FIG. 1A.

The pad 72 has a first width portion 72a and a second width portion 72b which are portions having different widths in the Y direction. The first width portion 72a is a portion including the upper base and the upper base proximity of the planar configuration of the trapezoidal configuration of the pad 72. The second width portion 72b is a portion formed further on the lower base side of the planar configuration of the trapezoidal configuration of the pad 72 than is the first width portion 72a.

Similarly, the other pad 73 also has a first width portion 73a and a second width portion 73b which are portions having different widths in the Y direction. The first width portion 73a is a portion including the upper base and the upper base proximity of the planar configuration of the trapezoidal configuration of the pad 73. The second width portion 73b is a portion formed further on the lower base side of the planar configuration of the trapezoidal configuration of the pad 73 than is the first width portion 73a.

The width of the first width portion 72a of the pad 72 in the Y direction is the same as the width of the electrode surface 61 in the Y direction or is slightly wider than the width of the electrode surface 61 in the Y direction. The width of the second width portion 72b in the Y direction is wider than the width of the first width portion 72a in the Y direction. The width of the second width portion 72b in the Y direction is wider than the width of the electrode surface 61 in the Y direction.

The width of the first width portion 73a of the pad 73 in the Y direction is the same as the width of the electrode surface 62 in the Y direction or is slightly wider than the width of the electrode surface 62 in the Y direction. The width of the second width portion 73b in the Y direction is wider than the width of the first width portion 73a in the Y direction. The width of the second width portion 73b in the Y direction is wider than the width of the electrode surface 62 in the Y direction.

The X-direction length of the pad 72 corresponding to the distance between the upper base and the lower base of the planar configuration of the trapezoidal configuration of the pad 72 is longer than the X-direction length of the electrode surface 61. The X-direction length of the pad 73 corresponding to the distance between the upper base and the lower base of the planar configuration of the trapezoidal configuration of the pad 73 is longer than the X-direction length of the electrode surface 62.

The pair of pads 72 and 73 is arranged with line symmetry in the X direction such that the upper bases of the planar configurations of the trapezoidal configurations face each other.

The electrode surfaces 61 and 62 and the pads 72 and 73 are made of metal materials. The electrode surface 61 is bonded to the pad 72 via the bonding agent that is conductive and is electrically connected to the pad 72. The electrode surface 62 is bonded to the pad 73 via the bonding agent that is conductive and is electrically connected to the pad 73.

The bonding agent, e.g., solder 83, is meltable by the heating of the reflow process. The solder 83 is not shown in FIG. 1A. Also, the solder 83 is not shown in FIG. 2A, FIG. 3A, and FIG. 4A described below that correspond to FIG. 1A.

One end portion 61a of the electrode surface 61 in the X direction is bonded to the pad 72 on the first width portion 72a of the pad 72 via the solder 83. The other end portion 61b of the electrode surface 61 in the X direction is bonded to the pad 72 on the second width portion 72b of the pad 72 via the solder 83.

One end portion 62a of the electrode surface 62 in the X direction is bonded to the pad 73 on the first width portion 73a of the pad 73 via the solder 83. The other end portion 62b of the electrode surface 62 in the X direction is bonded to the pad 73 on the second width portion 73b of the pad 73 via the solder 83.

Prior to mounting the device 1, the solder 83 is formed, for example, on the mounting surface 71 of the mounting substrate 70 in a paste form. Then, the device 1 is mounted on the solder 83; and the solder 83 is melted (reflowed) by adding heat. The surface of the melted solder 83 is rounded due to the surface tension; and subsequently, the solder 83 cools (including natural cooling) and hardens. Accordingly, the surface of the solder 83 has a curvature.

When comparing for the same solder supply amount, the curvature of the surface is smaller and the tilt of the surface is gentler for solder wetting over a wide region than for solder wetting over a narrow region. The widths of the pads 72 and 73 in the Y direction are not uniform but change continuously in the X direction; and the tilt in the Y direction is gentler for the solder 83 surface on the second width portions 72b and 73b, which have widths in the Y direction that are wider than those of the first width portions 72a and 73a, than for the solder 83 surface on the first width portions 72a and 73a.

In other words, the curvature of the surface of the solder 83 on the second width portion 72b of the pad 72 shown in FIG. 1C is smaller than the curvature of the surface of the solder 83 on the first width portion 72a of the pad 72 shown in FIG. 1B. When expressed as the curvature radius, the curvature radius of the surface of the solder 83 on the second width portion 72b is larger than the curvature radius of the surface of the solder 83 on the first width portion 72a.

Here, the curvature (the curvature radius) of the solder surface is the curvature (the curvature radius) of the solder surface in the cross-sectional views along the Y direction. In the description hereinafter as well, the curvature (the curvature radius) of the solder surface is the curvature (the curvature radius) of the solder surface in the cross-sectional views along the Y direction.

Although FIGS. 1B and 1C show the cross sections along the Y direction on the one pad 72, the cross section on the first width portion 73a is the same as FIG. 1B and the cross section on the second width portion 73b is the same as FIG. 1C for the cross sections along the Y direction on the other pad 73 as well.

Accordingly, the curvature of the surface of the solder 83 on the second width portion 73b of the pad 73 is smaller than the curvature of the surface of the solder 83 on the first width portion 73a of the pad 73. When expressed as the curvature radius, the curvature radius of the surface of the solder 83 on the second width portion 73b is larger than the curvature radius of the surface of the solder 83 on the first width portion 73a.

Figure 21A:
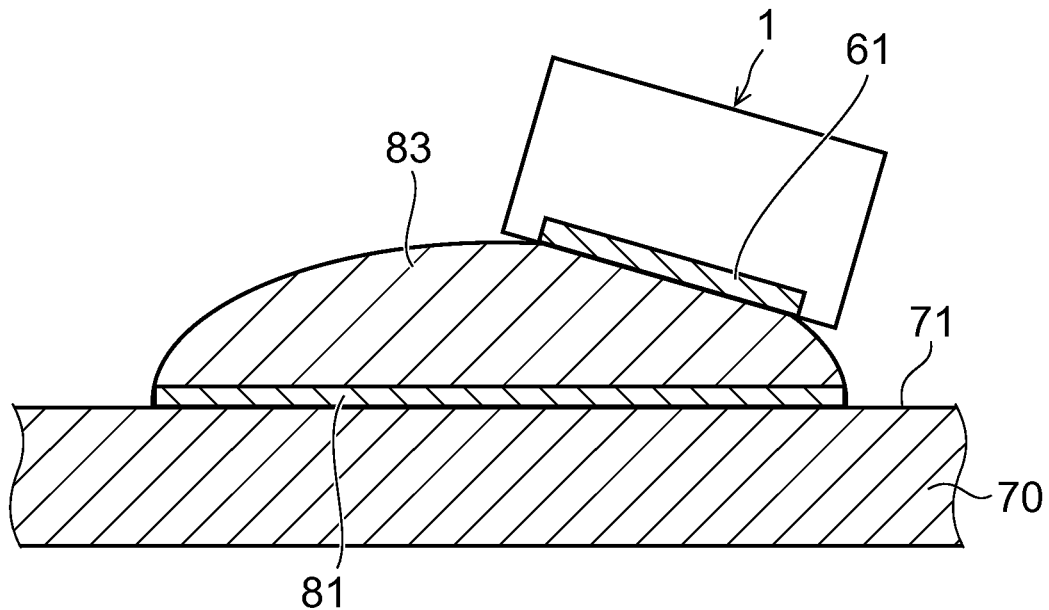
FIGS. 21A and 21B are schematic cross-sectional views of a device module of a comparative example.

FIG. 21A is a schematic cross-sectional view of a device module of a comparative example.

In the device module of the comparative example, the planar configuration of a pad 81 is formed in a square or rectangular configuration; and the width of the pad 81 does not change in the lateral direction and in the direction piercing the page surface in FIG. 21A.

In the reflow, the solder 83 has a configuration such that the surface area is a minimum due to the surface tension; and the surface area of the solder 83 does not fluctuate and a tilted surface is formed in the surface of the solder 83 no matter where the device 1 is mounted on the solder 83 surface. In the case where the device 1 is undesirably bonded to the tilted surface, the upper surface of the device 1 undesirably tilts with respect to the surface of the pad 81 as shown in FIG. 21A. In particular, in the case where the device 1 is an optical device such as a light emitting device, a light receiving device, etc., the optical axis undesirably tilts; and the optical characteristics are affected.

Figure 21B:
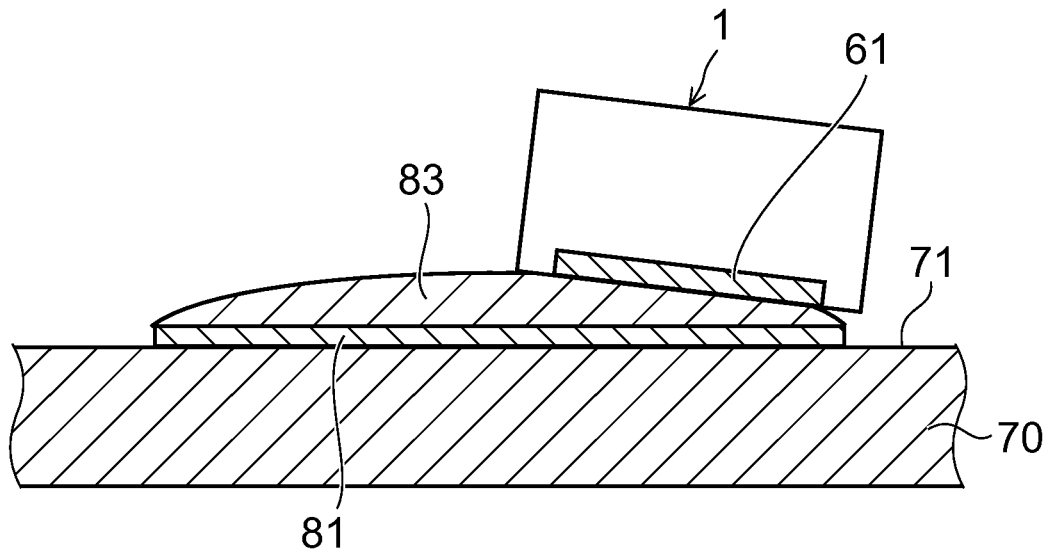

Moreover, in the case where the amount of the solder 83 is reduced as shown in FIG. 21B, the curvature of the surface decreases; and it is possible to reduce the tilt of the device 1 even in the case where the device 1 is mounted to be shifted toward the end side of the solder 83 surface. However, in the case where the solder amount is reduced, there is a risk that the bonding reliability may decrease.

Conversely, according to the embodiment, the other end portion 61b and 62b sides of the electrode surfaces 61 and 62 can be mounted on the solder 83 surface that is nearly a flat surface or has a gentle tilt because the curvature of the solder 83 surface on the second width portions 72b and 73b is smaller than the curvature of the solder 83 surface on the first width portions 72a and 73a.

The orientations of the electrode surfaces 61 and 62 on the one end portion 61a and 62a sides also are constrained by the orientations of the electrode surfaces 61 and 62 on the other end portion 61b and 62b sides; the tilting on the one end portion 61a and 62a sides of the electrode surfaces 61 and 62 also is regulated; and the tilt of the entire device 1 is regulated.

In other words, according to the embodiment, the tilt of the device 1 can be suppressed by causing the surface of the solder 83 to have a gentle tilt at the other end portion 61b and 62b sides of the electrode surfaces 61 and 62 while ensuring an amount of the solder 83 sufficient for the bonding reliability.

The Y direction movement of the electrode surfaces 61 and 62 on the one end portion 61a and 62a sides is regulated by the first width portions 72a and 73a which have Y-direction widths that are the same as or slightly wider than the widths of the electrode surfaces 61 and 62 in the Y direction. In other words, the region over which the solder 83 wets in the Y direction is limited at the one end portion 61a and 62a sides of the electrode surfaces 61 and 62; and the Y direction movement of the device 1 is regulated. Because the movement of the device 1 in the lateral direction in FIG. 1B is regulated, the tilting of the device 1 due to the device 1 shifting to the portion where the tilt of the solder 83 surface is large can be regulated.

The movement of the device 1 in the X direction is regulated by the pair of pads 72 and 73 being arranged in the X direction at a prescribed spacing. In other words, the electrode surface 61 is regulated from moving to the left of the edge of the pad 72 on the first width portion 72a side in FIG. 1A; and the electrode surface 62 is regulated from moving to the right of the edge of the pad 73 on the first width portion 73a side in FIG. 1A. As a result, the movement of the device 1 in the X direction is regulated.

The pair of pads 72 and 73 is formed with the same configuration and the same surface area and is arranged in the X direction with line symmetry with respect to a center line (a line extending in the Y direction) between the pair of pads 72 and 73. Accordingly, if the supply amount of the solder 83 is the same for each of the pads 72 and 73, the solder 83 similarly wets over each of the pads 72 and 73; and the heights (the peaks) of the solder 83 on each of the pads 72 and 73 can be matched. This suppresses the tilt of the device 1 in the X direction (the longitudinal direction).

Second Embodiment

Figure 2A:
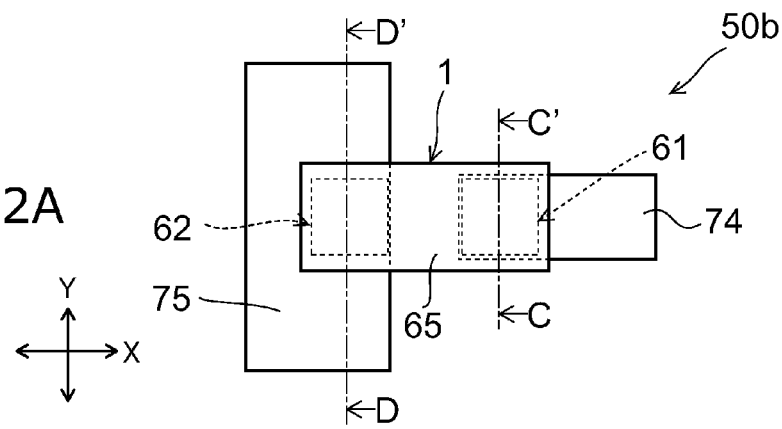
FIGS. 2A to 2C are schematic views of a device module of a second embodiment.

FIG. 2A is a schematic top view of a device module 50b of a second embodiment.

Figure 2B:
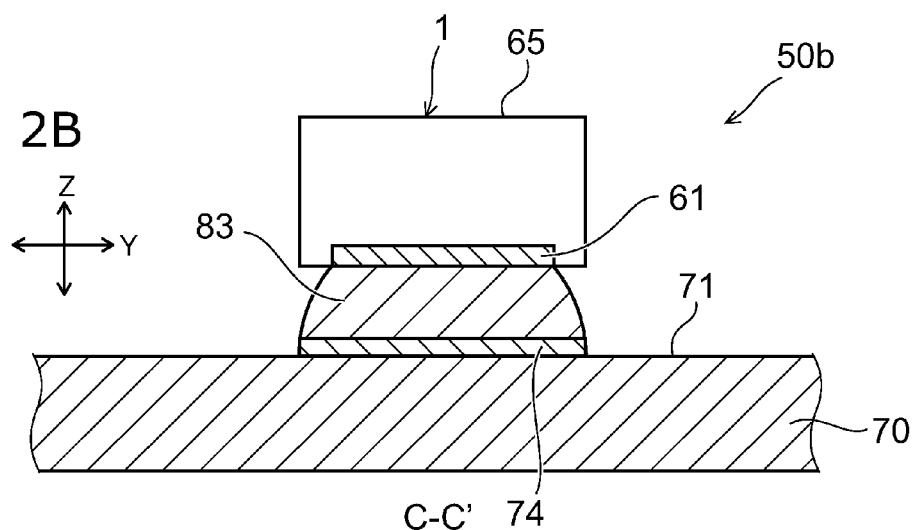

FIG. 2B is the C-C' enlarged cross-sectional view of FIG. 2A.

Figure 2C:
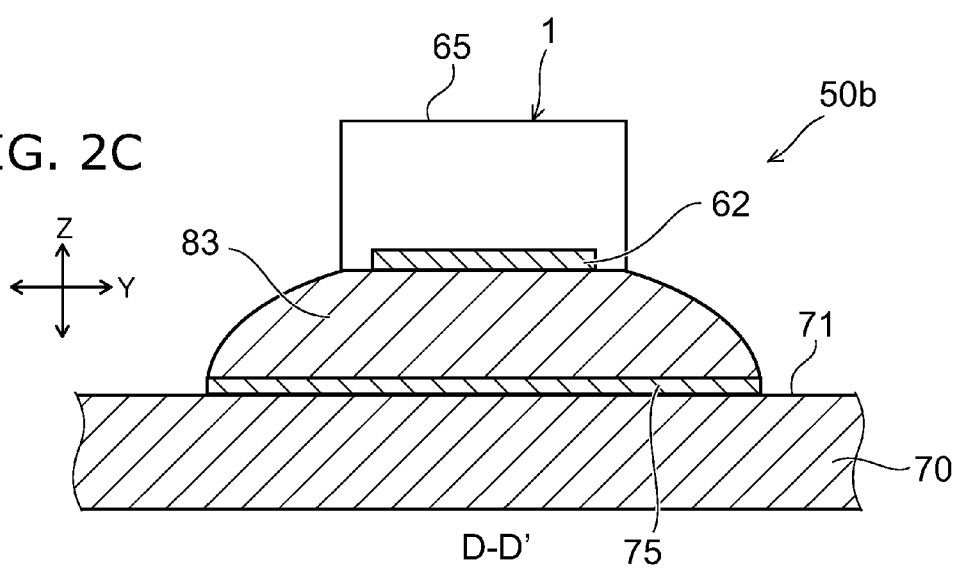

FIG. 2C is the D-D' enlarged cross-sectional view of FIG. 2A.

The device module 50b of the second embodiment also includes the mounting substrate 70 and the device 1 mounted on the mounting substrate 70. The configuration of the device 1 is the same as that of the first embodiment.

A pair of pads 74 and 75 is formed in the mounting surface 71 of the mounting substrate 70 to be arranged in the X direction to correspond to the pair of electrode surfaces 61 and 62 of the device 1.

The planar configuration of each of the pads 74 and 75 is formed in a rectangular configuration as shown in FIG. 2A. However, the longitudinal direction of the one pad 74 is the X direction; and the longitudinal direction of the other pad 75 is the Y direction.

The width of the pad 74 in the Y direction is the same as the width of the electrode surface 61 in the Y direction or is slightly wider than the width of the electrode surface 61 in the Y direction. The width of the pad 74 in the X direction is wider than the width of the electrode surface 61 in the X direction.

The width of the pad 75 in the Y direction is wider than the width of the pad 74 in the Y direction and is wider than the width of the electrode surface 62 in the Y direction. The width of the pad 75 in the X direction is wider than the width of the electrode surface 62 in the X direction.

The pads 74 and 75 are made of metal materials. The electrode surface 61 is bonded to the pad 74 via a bonding agent that is conductive, e.g., the solder 83, and is electrically connected to the pad 74. The electrode surface 62 is bonded to the pad 75 via the solder 83 and is electrically connected to the pad 75.

The solder 83 wets over the pad 75, which has a width in the Y direction that is larger than that of the pad 74, to be wider in the Y direction on the pad 75 than on the pad 74.

Accordingly, the curvature of the surface of the solder 83 on the pad 75 shown in FIG. 2C is smaller than the curvature of the surface of the solder 83 on the pad 74 shown in FIG. 2B. When expressed as the curvature radius, the curvature radius of the surface of the solder 83 on the pad 75 is larger than the curvature radius of the surface of the solder 83 on the pad 74.

According to the second embodiment, the electrode surface 62 can be mounted on the solder 83 surface that is nearly a flat surface or has a gentle tilt as shown in FIG. 2C because the curvature of the solder 83 surface on the pad 75 is smaller than the curvature of the solder 83 surface on the pad 74. The orientation on the one electrode surface 62 side is constrained; the tilt on the other electrode surface 61 side also is regulated; and the tilt of the entire device 1 is regulated.

In other words, according to the embodiment, the tilt of the device 1 can be suppressed by causing the surface of the solder 83 to have a gentle tilt on the electrode surface 62 side while ensuring an amount of the solder 83 sufficient for the bonding reliability.

Further, the Y direction movement of the device 1 on the electrode surface 61 side is regulated by the pad 74 having a Y-direction width which is the same as or slightly wider than the width of the electrode surface 61 in the Y direction. In other words, the Y direction movement of the device 1 is regulated by the region over which the solder 83 wets in the Y direction being limited on the electrode surface 61 side. The tilting of the device 1 due to the device 1 shifting to the portion where the tilt of the solder 83 surface is large can be regulated because the movement of the device 1 in the lateral direction in FIG. 2B is regulated.

The movement of the device 1 in the X direction is regulated by the pair of pads 74 and 75 being arranged in the X direction at a prescribed spacing. In other words, the electrode surface 61 is regulated from moving to the left of the edge of the pad 74 on the pad 75 side in FIG. 2A; and the electrode surface 62 is regulated from moving to the right of the edge of the pad 75 on the pad 74 side in FIG. 2A. As a result, the movement of the device 1 in the X direction is regulated.

Third Embodiment

Figure 3A:
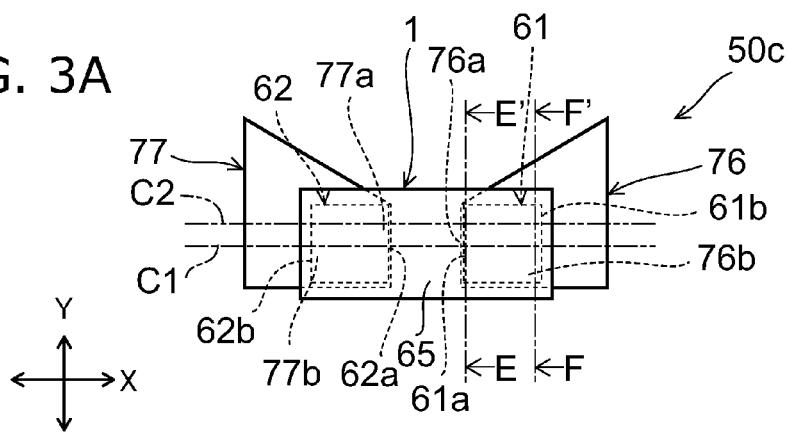
FIGS. 3A to 3C are schematic views of a device module of a third embodiment.

FIG. 3A is a schematic top view of a device module 50c of a third embodiment.

Figure 3B:
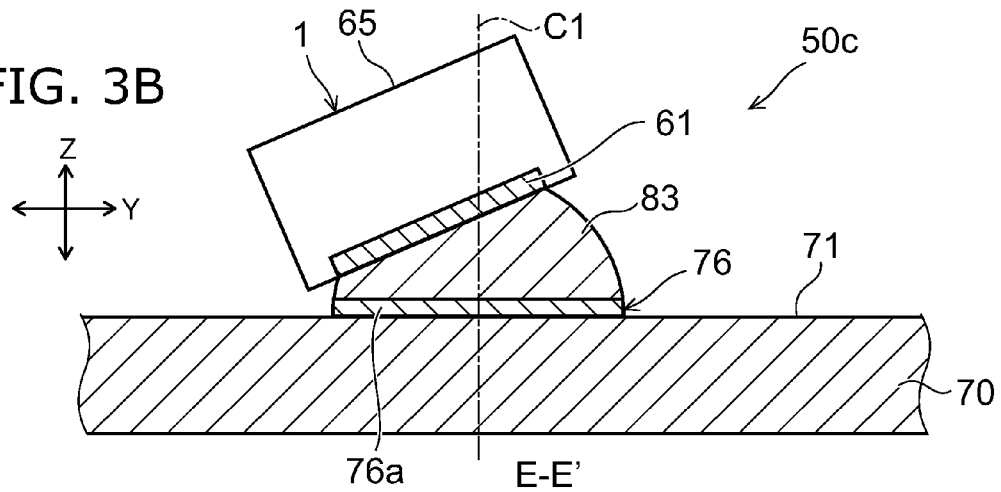

FIG. 3B is the E-E' enlarged cross-sectional view of FIG. 3A.

Figure 3C:
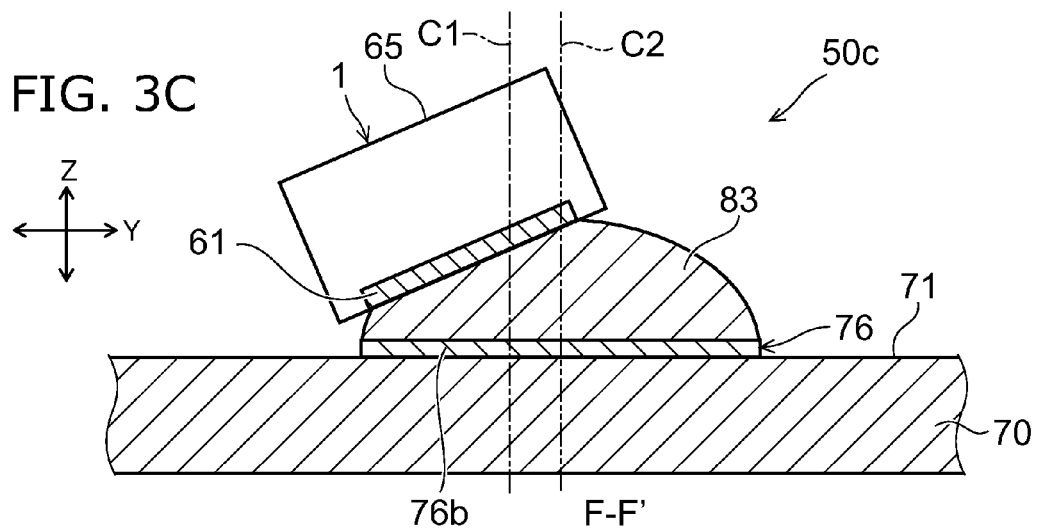

FIG. 3C is the F-F' enlarged cross-sectional view of FIG. 3A.

The device module 50c of the third embodiment also includes the mounting substrate 70 and the device 1 mounted on the mounting substrate 70. The configuration of the device 1 is the same as that of the first embodiment.

A pair of pads 76 and 77 is formed in the mounting surface 71 of the mounting substrate 70 to correspond to the pair of electrode surfaces 61 and 62 of the device 1. The planar configuration of each of the pads 76 and 77 is formed in a trapezoidal configuration as shown in FIG. 3A.

The pad 76 has a first width portion 76a and a second width portion 76b which are portions having different widths in the Y direction. The first width portion 76a is a portion including the upper base and the upper base proximity of the planar configuration of the trapezoidal configuration of the pad 76. The second width portion 76b is the portion formed further on the lower base side of the planar configuration of the trapezoidal configuration of the pad 76 than is the first width portion 76a.

Similarly, the other pad 77 includes a first width portion 77a and a second width portion 77b which are portions having different widths in the Y direction. The first width portion 77a is a portion including the upper base and the upper base proximity of the planar configuration of the trapezoidal configuration of the pad 77. The second width portion 77b is the portion formed further on the lower base side of the planar configuration of the trapezoidal configuration of the pad 77 than is the first width portion 77a.

The width of the first width portion 76a of the pad 76 in the Y direction is the same as the width of the electrode surface 61 in the Y direction or is slightly wider than the width of the electrode surface 61 in the Y direction. The width of the second width portion 76b in the Y direction is wider than the width of the first width portion 76a in the Y direction. The width of the second width portion 76b in the Y direction is wider than the width of the electrode surface 61 in the Y direction.

The width of the first width portion 77a of the pad 77 in the Y direction is the same as the width of the electrode surface 62 in the Y direction or is slightly wider than the width of the electrode surface 62 in the Y direction. The width of the second width portion 77b in the Y direction is wider than the width of the first width portion 77a in the Y direction. The width of the second width portion 77b in the Y direction is wider than the width of the electrode surface 62 in the Y direction.

The X-direction length of the pad 76 corresponding to the distance between the upper base and the lower base of the planar configuration of the trapezoidal configuration of the pad 76 is longer than the X-direction length of the electrode surface 61. The X-direction length of the pad 77 corresponding to the distance between the upper base and the lower base of the planar configuration of the trapezoidal configuration of the pad 77 is longer than the X-direction length of the electrode surface 62.

The pair of pads 76 and 77 is arranged with line symmetry in the X direction such that the upper bases of the planar configurations of the trapezoidal configurations face each other.

A Y-direction center position C1 (illustrated by a single dot-dash line in FIGS. 3A to 3C) of the first width portion 76a of the pad 76 is shifted in the Y direction from a Y-direction center position C2 (illustrated by the double dot-dash line in FIGS. 3A and 3C) of the second width portion 76b.

Similarly, the Y-direction center position C1 of the first width portion 77a of the pad 77 is shifted in the Y direction from the Y-direction center position C2 of the second width portion 77b.

The pads 76 and 77 are made of metal materials. The electrode surface 61 is bonded to the pad 76 via the solder 83 and is electrically connected to the pad 76. The electrode surface 62 is bonded to the pad 77 via the solder 83 and is electrically connected to the pad 77.

The one end portion 61a of the electrode surface 61 in the X direction is bonded to the pad 76 via the solder 83 on the first width portion 76a of the pad 76. The other end portion 61b of the electrode surface 61 in the X direction is bonded to the pad 76 via the solder 83 on the second width portion 76b of the pad 76.

The one end portion 62a of the electrode surface 62 in the X direction is bonded to the pad 77 via the solder 83 on the first width portion 77a of the pad 77. The other end portion 62b of the electrode surface 62 in the X direction is bonded to the pad 77 via the solder 83 on the second width portion 77b of the pad 77.

The widths of the pads 76 and 77 in the Y direction are not uniform but change continuously in the X direction; and the tilt in the Y direction is gentler for the solder 83 surface on the second width portions 76b and 77b, which have widths in the Y direction that are larger than those of the first width portions 76a and 77a, than for the solder 83 surface on the first width portions 76a and 77a.

In other words, the curvature of the surface of the solder 83 on the second width portion 76b of the pad 76 shown in FIG. 3C is smaller than the curvature of the surface of the solder 83 on the first width portion 76a of the pad 76 shown in FIG. 3B. When expressed as the curvature radius, the curvature radius of the surface of the solder 83 on the second width portion 76b is larger than the curvature radius of the surface of the solder 83 on the first width portion 76a.

Although FIGS. 3B and 3C show cross sections along the Y direction on the one pad 76, the cross section on the first width portion 77a is the same as FIG. 3B and the cross section on the second width portion 77b is the same as FIG. 3C for the cross sections along the Y direction on the other pad 77 as well.

Accordingly, the curvature of the surface of the solder 83 on the second width portion 77b of the pad 77 is smaller than the curvature of the surface of the solder 83 on the first width portion 77a of the pad 77. When expressed as the curvature radius, the curvature radius of the surface of the solder 83 on the second width portion 77b is larger than the curvature radius of the surface of the solder 83 on the first width portion 77a.

According to the third embodiment, the Y direction movement of the electrode surfaces 61 and 62 on the one end portion 61a and 62a sides is regulated by the first width portions 76a and 77a having Y-direction widths which are the same as or slightly wider than the Y-direction widths of the electrode surfaces 61 and 62. In other words, the region over which the solder 83 wets in the Y direction on the one end portion 61a and 62a sides of the electrode surfaces 61 and 62 is limited; and the Y direction movement of the device 1 is regulated.

Thus, the Y-direction center position of the device 1 is shifted from the Y-direction center position C2 of the second width portions 76b and 77b in the state in which the Y-direction position of the device 1 is regulated by the first width portions 76a and 77a.

As shown in FIG. 3C which is the cross-sectional view along the Y direction on the second width portion 76b of the pad 76, the position of the device 1 is shifted to the left side in FIG. 3C from the Y-direction center position C2 of the second width portion 76b.

In the cross section along the Y direction of the solder 83, the surface of the solder 83 is formed in a curved surface configuration having the peak height proximal to the Y-direction center position C2 of the second width portion 76b due to the surface tension of the reflow.

Accordingly, in the case where the device 1 is shifted from the Y-direction center position C2 of the second width portion 76b, the device 1 is positioned to be shifted onto the tilted surface which is on the end side of the apical portion of the solder 83.

Because the movement of the one end portion 61a side of the electrode surface 61 in the Y direction is regulated by the first width portion 76a as described above, the Y direction (lateral direction) movement of the device 1 is regulated in the state of FIG. 3C also on the other end portion 61b side of the electrode surface 61. Therefore, the tilted orientation of the device 1 is maintained.

Similarly for the other pad 77 as well, the device 1 is positioned to be shifted onto the tilted surface which is on the end side of the apical portion of the solder 83 in the case where the device 1 is shifted from the Y-direction center position C2 of the second width portion 77b of the pad 77. Further, because the movement of the one end portion 62a side of the electrode surface 62 in the Y direction is regulated by the first width portion 77a, the Y direction movement of the device 1 also is regulated on the other end portion 62b side of the electrode surface 62; and the tilted orientation of the device 1 is maintained.

It is possible to control the tilt angle of the device 1 with respect to the mounting surface 71 by the amount of the solder 83 and the width of the second width portions 76b and 77b in the Y direction. Accordingly, according to the third embodiment, it is possible to provide a device module 50c in which the tilt angle (of the upper surface 65) of the device 1 is arbitrarily controlled. In the case where the device 1 is, for example, an optical device, it is possible to control the angle of the optical axis with respect to the mounting surface 71.

The movement of the device 1 in the X direction is regulated by the pair of pads 76 and 77 being arranged in the X direction at a prescribed spacing. In other words, the electrode surface 61 is regulated from moving to the left of the edge of the pad 76 on the first width portion 76a side in FIG. 3A; and the electrode surface 62 is regulated from moving to the right of the edge of the pad 77 on the first width portion 77a side in FIG. 3A. As a result, the movement of the device 1 in the X direction is regulated.

The pair of pads 76 and 77 is formed with the same configuration and the same surface area and is arranged in the X direction with line symmetry with respect to a center line (a line extending in the Y direction) between the pair of pads 76 and 77. Therefore, if the supply amount of the solder 83 is the same for each of the pads 76 and 77, the solder 83 similarly wets over each of the pads 76 and 77; and the (peak) height of the solder 83 on each of the pads 76 and 77 can be matched. This suppresses the tilt of the device 1 in the X direction (the longitudinal direction).

Fourth Embodiment

Figure 4A:
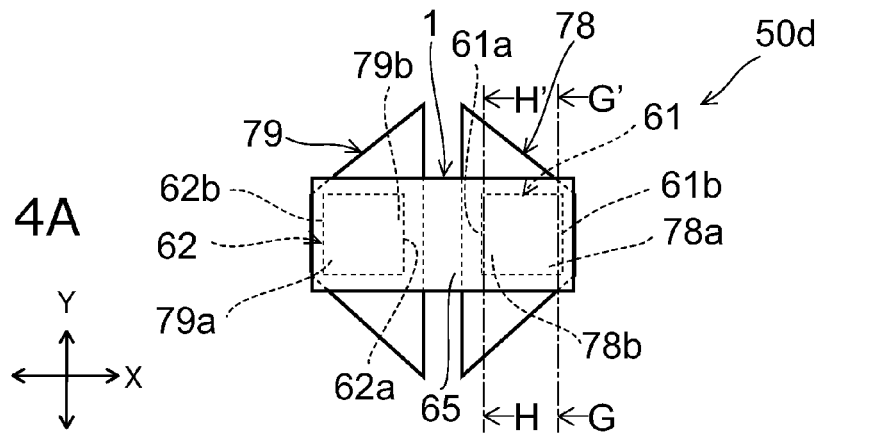
FIGS. 4A to 4C are schematic views of a device module of a fourth embodiment.

FIG. 4A is a schematic top view of a device module 50d of a fourth embodiment.

Figure 4B:
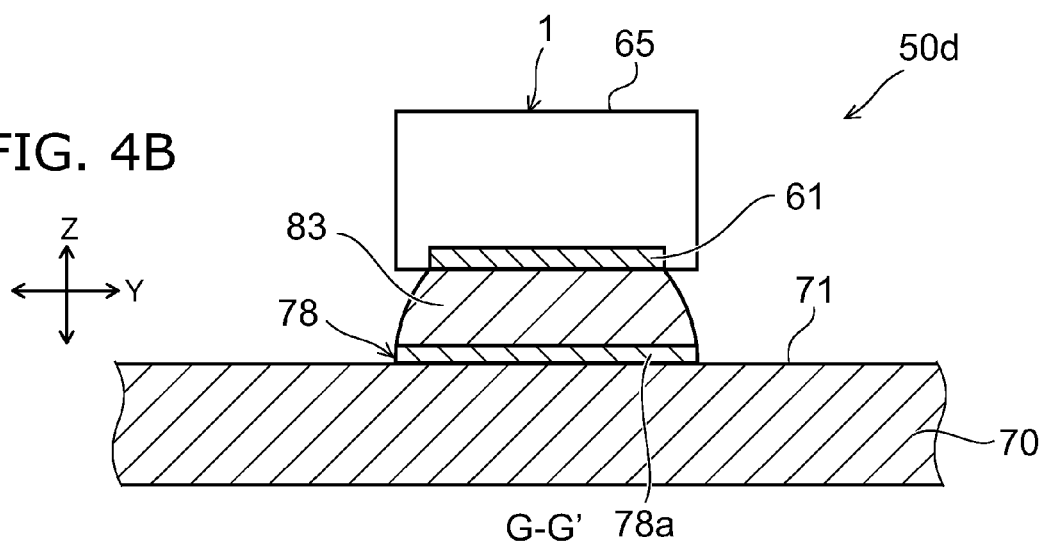

FIG. 4B is the G-G' enlarged cross-sectional view of FIG. 4A.

Figure 4C:
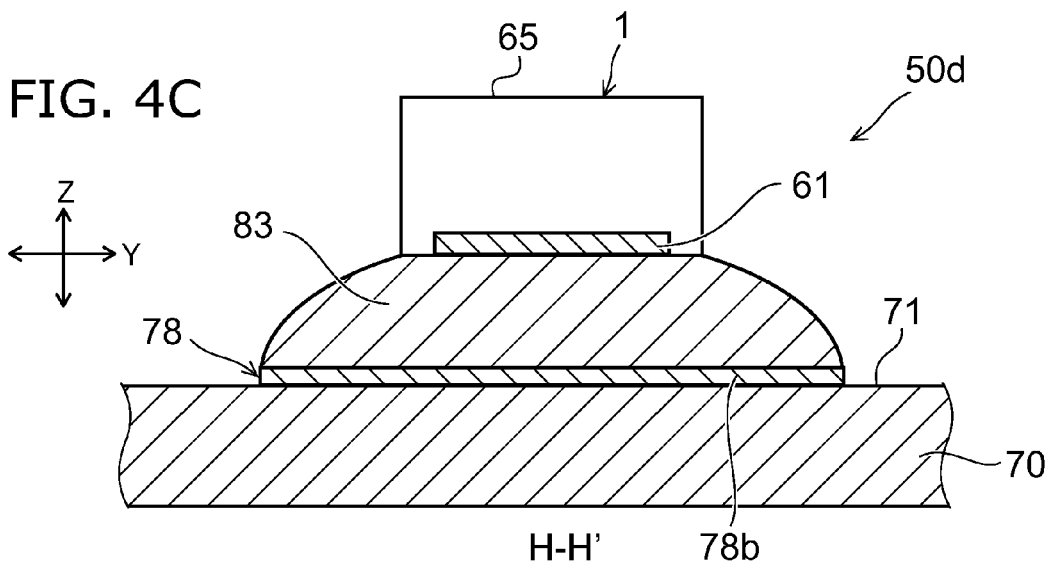

FIG. 4C is the H-H' enlarged cross-sectional view of FIG. 4A.

The device module 50d of the fourth embodiment also includes the mounting substrate 70 and the device 1 mounted on the mounting substrate 70. The configuration of the device 1 is the same as that of the first embodiment.

A pair of pads 78 and 79 is formed in the mounting surface 71 of the mounting substrate 70 to correspond to the pair of electrode surfaces 61 and 62 of the device 1. The planar configuration of each of the pads 78 and 79 is formed in a trapezoidal configuration as shown in FIG. 4A.

The pad 78 has a first width portion 78a and a second width portion 78b which are portions having different widths in the Y direction. The first width portion 78a is a portion including the upper base and the upper base proximity of the planar configuration of the trapezoidal configuration of the pad 78. The second width portion 78b is the portion formed further on the lower base side of the planar configuration of the trapezoidal configuration of the pad 78 than is the first width portion 78a.

Similarly, the other pad 79 has a first width portion 79a and a second width portion 79b which are portions having different widths in the Y direction. The first width portion 79a is a portion including the upper base and the upper base proximity of the planar configuration of the trapezoidal configuration of the pad 79. The second width portion 79b is the portion formed further on the lower base side of the planar configuration of the trapezoidal configuration of the pad 79 than is the first width portion 79a.

The width of the first width portion 78a of the pad 78 in the Y direction is the same as the width of the electrode surface 61 in the Y direction or is slightly wider than the width of the electrode surface 61 in the Y direction. The width of the second width portion 78b in the Y direction is wider than the width of the first width portion 78a in the Y direction. The width of the second width portion 78b in the Y direction is wider than the width of the electrode surface 61 in the Y direction.

The width of the first width portion 79a of the pad 79 in the Y direction is the same as the width of the electrode surface 62 in the Y direction and is slightly wider than the width of the electrode surface 62 in the Y direction. The width of the second width portion 79b in the Y direction is wider than the width of the first width portion 79a in the Y direction. The width of the second width portion 79b in the Y direction is wider than the width of the electrode surface 62 in the Y direction.

The X-direction length of the pad 78 corresponding to the distance between the upper base and the lower base of the planar configuration of the trapezoidal configuration of the pad 78 is longer than the X-direction length of the electrode surface 61. The X-direction length of the pad 79 corresponding to the distance between the upper base and the lower base of the planar configuration of the trapezoidal configuration of the pad 79 is longer than the X-direction length of the electrode surface 62.

The pair of pads 78 and 79 is different from the pads 72 and 73 of the first embodiment shown in FIG. 1A and is arranged with line symmetry in the X direction such that the lower bases of the planar configurations of the trapezoidal configurations face each other.

The pads 78 and 79 are made of metal materials. The electrode surface 61 is bonded to the pad 78 via the solder 83 and is electrically connected to the pad 78. The electrode surface 62 is bonded to the pad 79 via the solder 83 and is electrically connected to the pad 79.

The one end portion 61a of the electrode surface 61 in the X direction is bonded to the pad 78 via the solder 83 on the second width portion 78b of the pad 78. The other end portion 61b of the electrode surface 61 in the X direction is bonded to the pad 78 via the solder 83 on the first width portion 78a of the pad 78.

The one end portion 62a of the electrode surface 62 in the X direction is bonded to the pad 79 via the solder 83 on the second width portion 79b of the pad 79. The other end portion 62b of the electrode surface 62 in the X direction is bonded to the pad 79 via the solder 83 on the first width portion 79a of the pad 79.

The widths of the pads 78 and 79 in the Y direction are not uniform but change continuously in the X direction; and the tilt in the Y direction is gentler for the solder 83 surface on the second width portions 78b and 79b, which have Y-direction widths that are larger than those of the first width portions 78a and 79a, than for the solder 83 surface on the first width portions 78a and 79a.

In other words, the curvature of the surface of the solder 83 on the second width portion 78b of the pad 78 shown in FIG. 4C is smaller than the curvature of the surface of the solder 83 on the first width portion 78a of the pad 78 shown in FIG. 4B. When expressed as the curvature radius, the curvature radius of the surface of the solder 83 on the second width portion 78b is larger than the curvature radius of the surface of the solder 83 on the first width portion 78a.

Although FIGS. 4B and 4C show cross sections along the Y direction on the one pad 78, the cross section on the first width portion 79a is the same as FIG. 4B and the cross section on the second width portion 79b is the same as FIG. 4C for the cross sections along the Y direction on the other pad 79 as well.

Accordingly, the curvature of the surface of the solder 83 on the second width portion 79b of the pad 79 is smaller than the curvature of the surface of the solder 83 on the first width portion 79a of the pad 79. When expressed as the curvature radius, the curvature radius of the surface of the solder 83 on the second width portion 79b is larger than the curvature radius of the surface of the solder 83 on the first width portion 79a.

According to the fourth embodiment, the one end portion 61a and 62a sides of the electrode surfaces 61 and 62 can be mounted on the solder 83 surface that is nearly a flat surface or has a gentle tilt because the curvature of the solder 83 surface on the second width portions 78b and 79b is smaller than the curvature of the solder 83 surface on the first width portions 78a and 79a. The orientations of the electrode surfaces 61 and 62 on the other end portion 61b and 62b sides also are constrained by the orientations of the electrode surfaces 61 and 62 on the one end portion 61a and 62a sides; the tilting on the other end portion 61b and 62b sides of the electrode surfaces 61 and 62 are regulated; and the tilt of the entire device 1 is regulated.

In other words, according to the fourth embodiment, the tilt of the device 1 can be suppressed by causing the surface of the solder 83 to have a gentle tilt on the one end portion 61a and 62a sides of the electrode surfaces 61 and 62 while ensuring an amount of the solder 83 sufficient for the bonding reliability.

Further, the Y direction movement of the electrode surfaces 61 and 62 on the other end portion 61b and 62b sides is regulated by the first width portions 78a and 79a having Y-direction widths which are the same as or slightly wider than the Y-direction widths of the electrode surfaces 61 and 62. In other words, the region over which the solder 83 wets in the Y direction is limited on the other end portion 61b and 62b sides of the electrode surfaces 61 and 62; and the Y direction movement of the device 1 is regulated. Because the movement of the device 1 in the lateral direction in FIG. 4B is regulated, the tilting of the device 1 due to the device 1 shifting to the portion where the tilt of the solder 83 surface is large can be regulated.

The movement of the device 1 in the X direction is regulated by the pair of pads 78 and 79 being arranged in the X direction at a prescribed spacing. In other words, the electrode surface 61 is regulated from moving to the right of the edge of the pad 78 on the first width portion 78a side in FIG. 4A; and the electrode surface 62 is regulated from moving to the left of the edge of the pad 79 on the first width portion 79a side in FIG. 4A. As a result, the movement of the device 1 in the X direction is regulated.

The pair of pads 78 and 79 is formed with the same configuration and the same surface area and is arranged in the X direction with line symmetry with respect to a center line (a line extending in the Y direction) between the pair of pads 78 and 79. Therefore, if the supply amount of the solder 83 is the same for each of the pads 78 and 79, the solder 83 similarly wets over each of the pads 78 and 79; and the (peak) height of the solder 83 on each of the pads 78 and 79 can be matched. This suppresses the tilt of the device 1 in the X direction (the longitudinal direction).

An embodiment in which a semiconductor light emitting device is illustrated as the device to be mounted will now be described.

Fifth Embodiment

Figure 5:
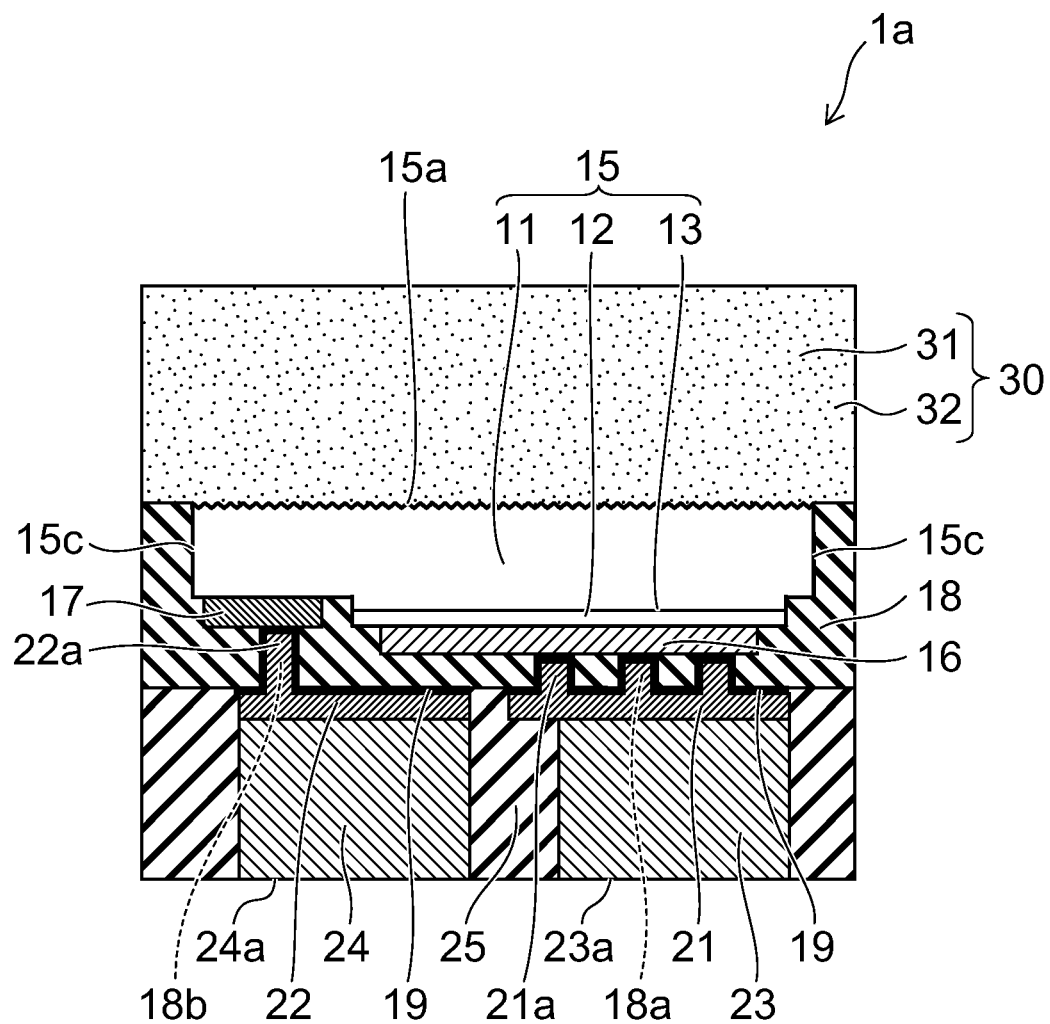
FIG. 5 is a schematic cross-sectional view of a device of a fifth embodiment.

FIG. 5 is a schematic cross-sectional view of a semiconductor light emitting device 1a as the device of a fifth embodiment.

The semiconductor light emitting device 1a includes a semiconductor layer 15 that includes a light emitting layer 13. The semiconductor layer 15 has a first surface 15a and a second surface on the side opposite to the first surface 15a. Electrodes and interconnect units are provided on the second surface side; and light is radiated to the outside mainly from the first surface 15a where the electrodes and the interconnect units are not provided.

The semiconductor layer 15 includes a first semiconductor layer 11 and a second semiconductor layer 12. The first semiconductor layer 11 and the second semiconductor layer 12 include, for example, gallium nitride. The first semiconductor layer 11 includes, for example, a foundation buffer layer, an n-type GaN layer, etc. The second semiconductor layer 12 includes a p-type GaN layer, the light emitting layer (the active layer) 13, etc. The light emitting layer 13 may include a material that emits blue light, violet light, bluish-violet light, ultraviolet light, etc.

The second surface of the semiconductor layer 15 is patterned into an uneven configuration with a protrusion that includes the light emitting layer 13. A p-side electrode 16 is provided on the surface of the second semiconductor layer 12 which is the surface of the protrusion. In other words, the p-side electrode 16 is provided on the second surface in the region including the light emitting layer 13.

An n-side electrode 17 is provided on the surface of the first semiconductor layer 11 in a region not including the light emitting layer 13 that is provided beside the protrusion of the second surface of the semiconductor layer 15. In other words, the n-side electrode 17 is provided on the second surface in the region not including the light emitting layer 13.

As shown in FIG. 12B as viewed from the second surface of the semiconductor layer 15, the surface area of the p-side electrode 16 provided in the region including the light emitting layer 13 is greater than that of the n-side electrode 17 provided in the region not including the light emitting layer 13. Thereby, a wide light emitting region is obtained. The layout of the p-side electrode 16 and the n-side electrode 17 shown in FIG. 12B is an example and is not limited thereto.

A first insulating film (hereinbelow, called simply the insulating film) 18 is provided on the second surface side of the semiconductor layer 15. The insulating film 18 covers the semiconductor layer 15, the p-side electrode 16, and the n-side electrode 17. The insulating film 18 also covers and protects the side surfaces of the light emitting layer 13 and the second semiconductor layer 12.

There are cases where another insulating film (e.g., a silicon oxide film) is provided between the insulating film 18 and the semiconductor layer 15. The insulating film 18 is, for example, a resin such as polyimide, etc., having excellent patternability of fine openings. Or, an inorganic film such as a silicon oxide film, a silicon nitride film, etc., may be used as the insulating film 18.

The insulating film 18 is not provided on the first surface 15a of the semiconductor layer 15. The insulating film 18 covers and protects a side surface 15c of the semiconductor layer 15 continuing from the first surface 15a.

A p-side interconnect layer 21 and an n-side interconnect layer 22 are provided to be separated from each other on the surface of the insulating film 18 on the side opposite to the second surface of the semiconductor layer 15.

Multiple first openings 18a are made in the insulating film 18 to reach the p-side electrode 16; and the p-side interconnect layer 21 is electrically connected to the p-side electrode 16 by means of first vias 21a provided inside the first openings 18a.

A first opening 18b is made in the insulating film 18 to reach the n-side electrode 17; and the n-side interconnect layer 22 is electrically connected to the n-side electrode 17 by means of a second via 22a provided inside the first opening 18b.

A p-type metal pillar 23 is provided on the surface of the p-side interconnect layer 21 on the side opposite to the p-side electrode 16. The p-side interconnect layer 21, the p-type metal pillar 23, and a metal film 19 used as a seed layer described below are included in a p-side interconnect unit of the embodiment.

An n-side metal pillar 24 is provided on the surface of the n-side interconnect layer 22 on the side opposite to the n-side electrode 17. The n-side interconnect layer 22, the n-side metal pillar 24, and the metal film 19 used as the seed layer described below are included in an n-side interconnect unit of the embodiment.

For example, a resin layer 25 is stacked on the insulating film 18 as a second insulating film. The resin layer 25 covers the periphery of the p-side interconnect unit and the periphery of the n-side interconnect unit. The resin layer 25 is filled between the p-type metal pillar 23 and the n-side metal pillar 24.

The side surface of the p-type metal pillar 23 and the side surface of the n-side metal pillar 24 are covered with the resin layer 25. The surface of the p-type metal pillar 23 on the side opposite to the p-side interconnect layer 21 is exposed from the resin layer 25 and functions as a p-side electrode surface 23a. The surface of the n-side metal pillar 24 on the side opposite to the n-side interconnect layer 22 is exposed from the resin layer 25 and functions as an n-side electrode surface 24a.

Figure 8A:
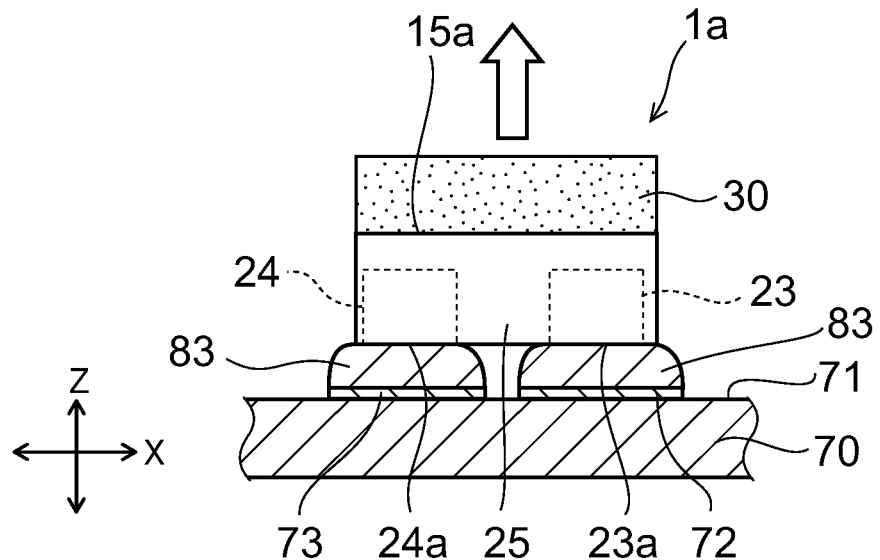
FIG. 8A is a schematic cross-sectional view of a device module in which the device of the fifth embodiment is mounted.

The p-side electrode surface 23a and the n-side electrode surface 24a are respectively bonded to the pads 72 and 73 formed in the mounting substrate 70 via the solder 83 as shown in FIG. 8A.

The distance between the p-side electrode surface 23a and the n-side electrode surface 24a exposed at the same surface (the lower surface in FIG. 5) of the resin layer 25 is greater than the distance between the p-side interconnect layer 21 and the n-side interconnect layer 22 on the insulating film 18. The p-side electrode surface 23a and the n-side electrode surface 24a are separated by a distance such that the p-side electrode surface 23a and the n-side electrode surface 24a are not shorted to each other by the solder 83 when mounting on the mounting substrate 70.

The p-side interconnect layer 21 can be proximal to the n-side interconnect layer 22 to the limits of the processes; and the surface area of the p-side interconnect layer 21 can be increased. As a result, the contact surface area between the p-side interconnect layer 21 and the p-side electrode 16 can be increased; and the current distribution and the heat dissipation can be improved.

The surface area of the p-side interconnect layer 21 contacting the p-side electrode 16 by means of the multiple first vias 21a is greater than the surface area of the n-side interconnect layer 22 contacting the n-side electrode 17 by means of the second via 22b. Therefore, the current distribution to the light emitting layer 13 can be improved; and the heat dissipation of the heat of the light emitting layer 13 can be improved.

The surface area of the n-side interconnect layer 22 spreading over the insulating film 18 is greater than the surface area of the n-side interconnect layer 22 contacting the n-side electrode 17.

According to the fifth embodiment, a high light output can be obtained by the light emitting layer 13 formed over the region that is larger than the n-side electrode 17. Further, the n-side electrode 17 provided in the region that is narrower than the region including the light emitting layer 13 is drawn out to the electrode surface 24a side as the n-side interconnect layer 22 that has a larger surface area.

The first semiconductor layer 11 is electrically connected to the n-side metal pillar 24 including the n-side electrode surface 24a via the n-side electrode 17, the metal film 19, and the n-side interconnect layer 22. The second semiconductor layer 12 including the light emitting layer 13 is electrically connected to the p-type metal pillar 23 including the p-side electrode surface 23a via the p-side electrode 16, the metal film 19, and the p-side interconnect layer 21.

The p-type metal pillar 23 is thicker than the p-side interconnect layer 21; and the n-side metal pillar 24 is thicker than the n-side interconnect layer 22. The thicknesses of the p-type metal pillar 23, the n-side metal pillar 24, and the resin layers 25 are thicker than the semiconductor layer 15. Here, "thickness" refers to the thickness in the vertical direction in FIG. 5.

The thicknesses of the p-type metal pillar 23 and the n-side metal pillar 24 are thicker than the thickness of the stacked body including the semiconductor layer 15, the p-side electrode 16, the n-side electrode 17, and the insulating film 18. The aspect ratios (the ratios of the thickness to the planar size) of the metal pillars 23 and 24 are not limited to being 1 or more and may be smaller than 1. In other words, the thicknesses of the metal pillars 23 and 24 may be less than the planar sizes of the metal pillars 23 and 24.

According to the fifth embodiment, even if a substrate 10 described below that is used to form the semiconductor layer 15 is removed, the semiconductor layer 15 can be stably supported by the support body including the p-type metal pillar 23, the n-side metal pillar 24, and the resin layer 25; and the mechanical strength of the semiconductor light emitting device 1a can be increased.

Copper, gold, nickel, silver, etc., may be used as the materials of the p-side interconnect layer 21, the n-side interconnect layer 22, the p-type metal pillar 23, and the n-side metal pillar 24. Among these, good thermal conductivity, high migration resistance, and excellent adhesion with insulating materials are obtained when copper is used.

The resin layer 25 reinforces the p-type metal pillar 23 and the n-side metal pillar 24. It is desirable for the resin layer 25 to have a coefficient of thermal expansion near to or the same as that of the mounting substrate. Examples of such a resin layer 25 include, for example, an epoxy resin, a silicone resin, a fluorocarbon resin, etc.

The stress applied to the semiconductor layer 15 via the solder 83 in the state in which the semiconductor light emitting device 1a is mounted on the mounting substrate 70 via the p-side electrode surface 23a and the n-side electrode surface 24a can be relaxed by being absorbed by the p-type metal pillar 23 and the n-side metal pillar 24.

The p-side interconnect unit including the p-side interconnect layer 21 and the p-type metal pillar 23 is connected to the p-side electrode 16 by means of the multiple first vias 21a that are partitioned from each other. Therefore, a high stress relieving effect is obtained by the p-side interconnect unit.

Figure 6A:
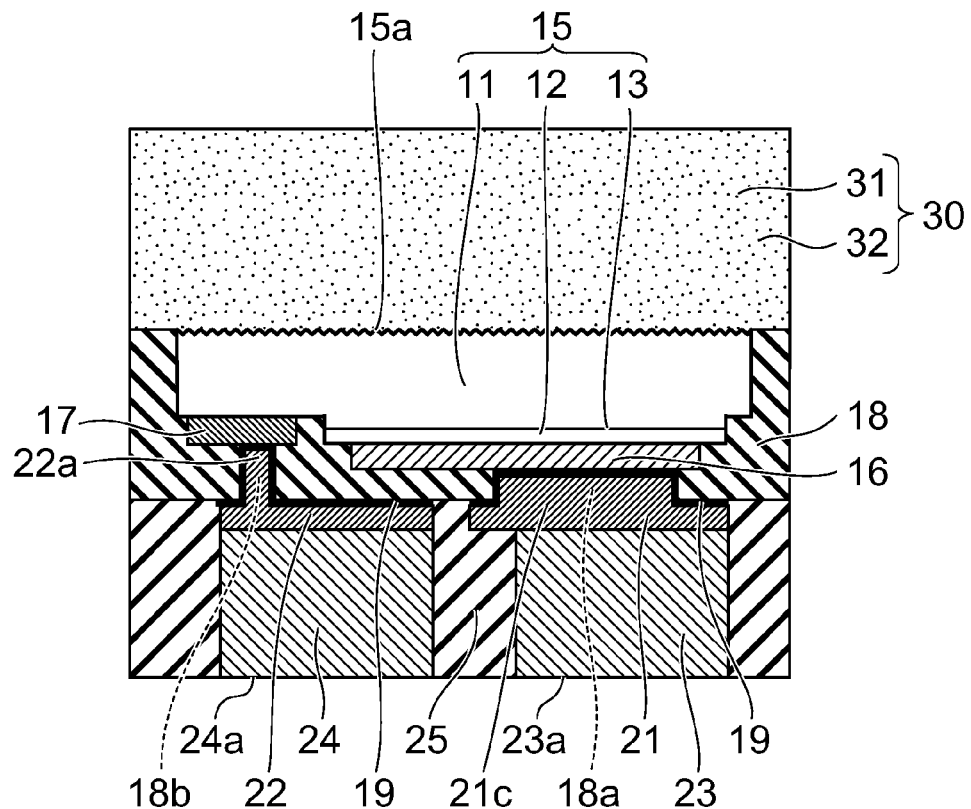
FIG. 6A is a schematic cross-sectional view of another device of the fifth embodiment.

Or, as shown in FIG. 6A, the p-side interconnect layer 21 may be connected to the p-side electrode 16 by means of a via 21c provided inside one large first opening 18a, where the via 21c has a planar size that is larger than that of the via 21a. In such a case, the heat dissipation of the light emitting layer 13 via the p-side electrode 16, the p-side interconnect layer 21, and the p-type metal pillar 23 which are metals can be improved.

As described below, the substrate 10 used when forming the semiconductor layer 15 is removed from the first surface 15a. Therefore, the semiconductor light emitting device 1a can be thinner.

A micro unevenness is formed in the first surface 15a of the semiconductor layer 15. The unevenness is formed by performing wet etching (frosting) on the first surface 15a using, for example, an alkaline solution. By providing the unevenness in the first surface 15a, which is the main extraction surface of the light emitted by the light emitting layer 13, the light that is incident on the first surface 15a at various angles can be extracted outside the first surface 15a without undergoing total internal reflection.

A phosphor layer 30 is provided on the first surface 15a. The phosphor layer 30 includes a transparent resin 31 as a transparent medium and a phosphor 32 having multiple particle configurations dispersed in the transparent resin 31.

The transparent resin 31 is transmissive to the emitted light (the excitation light) of the light emitting layer 13 and the fluorescence of the phosphor 32 and may include, for example, a silicone resin, an acrylic resin, a phenyl resin, etc.

The phosphor 32 is capable of absorbing the excitation light of the light emitting layer 13 and emitting a wavelength-converted light. Therefore, the semiconductor light emitting device 1a is capable of emitting a mixed light of the excitation light of the light emitting layer 13 and the wavelength-converted light of the phosphor 32.

For example, white, lamp, etc., can be obtained as a mixed color of the blue light of the light emitting layer 13 which is a GaN-based material and the yellow light which is the wavelength-converted light of the phosphor 32 in the case where the phosphor 32 is a yellow phosphor that emits yellow light. The phosphor layer 30 may have a configuration including multiple types of phosphors (e.g., a red phosphor that emits red light and a green phosphor that emits green light).

FIG. 8A is a schematic cross-sectional view of a light emitting device module in which the semiconductor light emitting device 1a of the fifth embodiment is mounted on the mounting substrate 70.

For example, the pads 72 and 73 of the first embodiment described above are formed in the mounting surface 71 of the mounting substrate 70; the p-side electrode surface 23a is bonded to the pad 72 via the solder 83; and the n-side electrode surface 24a is bonded to the pad 73 via the solder 83.

The first surface 15a of the semiconductor light emitting device 1a faces upward from the mounting surface 71 in an orientation in which the mounting surface 71 is under the semiconductor light emitting device 1a; and the light is radiated mainly upward from the mounting surface 71. In other words, the optical axis of the semiconductor light emitting device 1a is perpendicular to the mounting surface 71.

In the light emitting device module as well, similarly to the first embodiment described above, it is possible to suppress the tilt (of the optical axis) of the semiconductor light emitting device 1a by the pads 72 and 73 having the first width portion and the second width portion which have different widths in the Y direction and by performing the mounting. Accordingly, a light emitting device module having the desired optical characteristics can be provided.

The semiconductor light emitting device 1a may be mounted on the pads 74 and 75 of the second embodiment or the pads 78 and 79 of the fourth embodiment. In such a case as well, the tilt of the optical axis of the semiconductor light emitting device 1a can be suppressed.

Or, as in the third embodiment, the semiconductor light emitting device 1a may be mounted on the pads 76 and 77. In such a case, it is possible to mount the semiconductor light emitting device 1a with the optical axis of the semiconductor light emitting device 1a tilted at any angle with respect to the mounting surface 71.

A method for manufacturing the semiconductor light emitting device 1a of the fifth embodiment will now be described with reference to FIG. 9A to FIG. 20B. FIG. 9A to FIG. 20B show a region of a portion in the wafer state.

FIG. 9A shows a stacked body in which the first semiconductor layer 11 and the second semiconductor layer 12 are formed on a major surface (in FIG. 9A, the lower surface) of the substrate 10. FIG. 9B corresponds to the bottom view of FIG. 9A.

The first semiconductor layer 11 is formed on the major surface of the substrate 10; and the second semiconductor layer 12 including the light emitting layer 13 is formed on the first semiconductor layer 11. Crystal growth of the first semiconductor layer 11 and the second semiconductor layer 12 which include gallium nitride may be performed by, for example, MOCVD (metal organic chemical vapor deposition) on a sapphire substrate. Or, a silicon substrate may be used as the substrate 10.

The surface of the first semiconductor layer 11 contacting the substrate 10 is the first surface 15a of the semiconductor layer 15; and the surface of the second semiconductor layer 12 is a second surface 15b of the semiconductor layer 15.

Then, a trench 80 is made to reach the substrate 10 by piercing the semiconductor layer 15 as shown in FIG. 10A and FIG. 10B which is the bottom view of FIG. 10A by, for example, RIE (Reactive Ion Etching) using a not-shown resist. The trench 80 is formed in, for example, a lattice configuration on the substrate 10 in the wafer state and separates the semiconductor layer 15 into multiple chips on the substrate 10.

The process of multiply separating the semiconductor layer 15 may be performed after the selective removal of the second semiconductor layer 12 described below or after the formation of the electrodes.

Figures 11A, 11B:
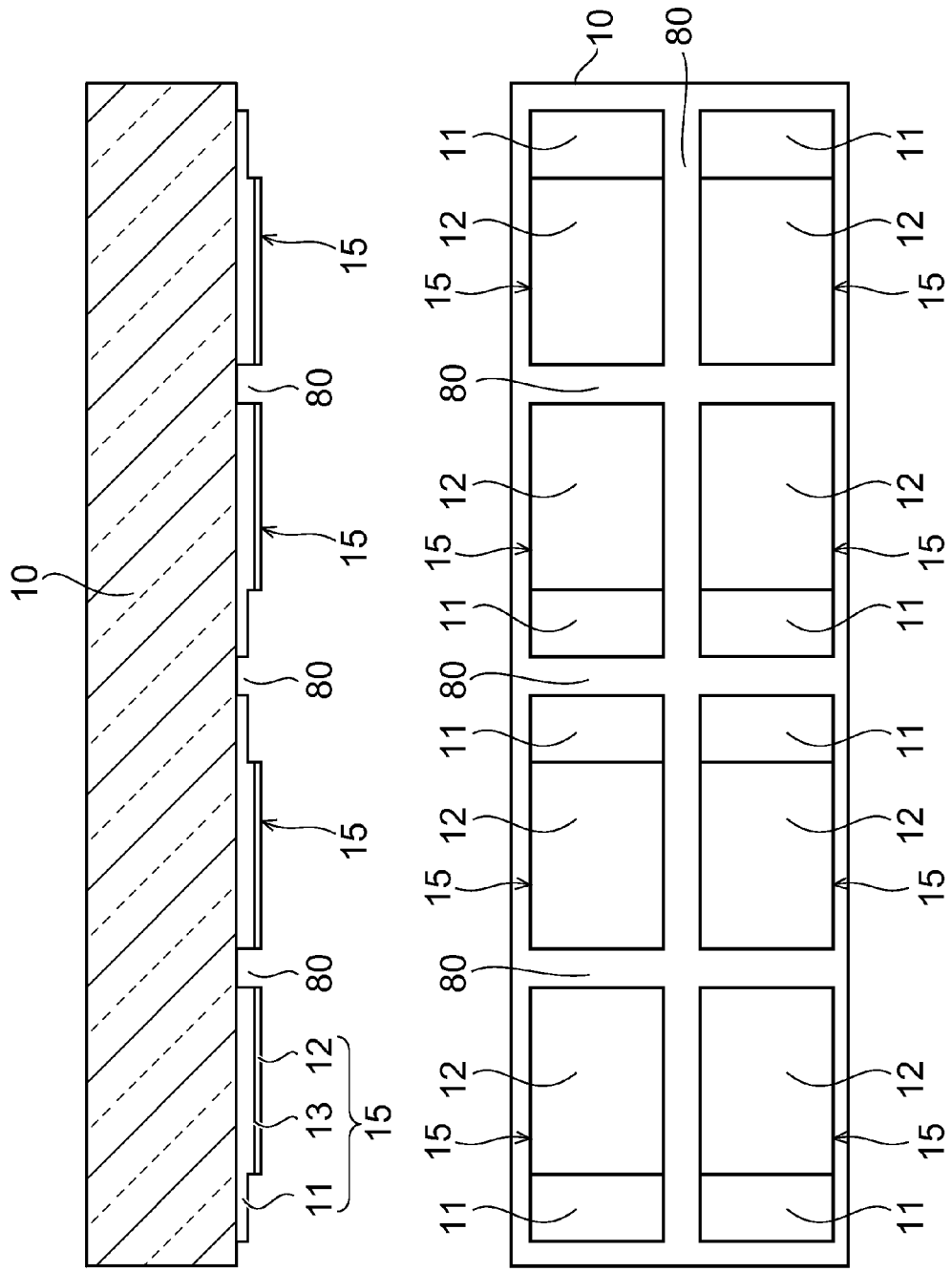

Then, a portion of the first semiconductor layer 11 is exposed by removing a portion of the second semiconductor layer 12 as shown in FIG. 11A and FIG. 11B which is the bottom view of FIG. 11A by, for example, RIE using a not-shown resist. The region where the first semiconductor layer 11 is exposed does not include the light emitting layer 13.

Then, as shown in FIG. 12A and FIG. 12B which is the bottom view of FIG. 12A, the p-side electrode 16 and the n-side electrode 17 are formed on the second surface of the semiconductor layer 15. The p-side electrode 16 is formed on the surface of the second semiconductor layer 12. The n-side electrode 17 is formed on the exposed surface of the first semiconductor layer 11.

The p-side electrode 16 and the n-side electrode 17 are formed by, for example, sputtering, vapor deposition, etc. Either one of the p-side electrode 16 and the n-side electrode 17 may be formed first; and the p-side electrode 16 and the n-side electrode 17 may be formed simultaneously from the same material.

The p-side electrode 16 includes, for example, silver, silver alloy, aluminum, aluminum alloy, etc., that are reflective to the excitation light of the light emitting layer 13. A configuration including a metal protective film (a barrier metal) also may be used to prevent sulfidization and oxidization of the p-side electrode 16.

For example, a silicon nitride film and/or a silicon oxide film may be formed as a passivation film between the p-side electrode 16 and the n-side electrode 17 and on the end surface (the side surface) of the light emitting layer 13 by CVD (chemical vapor deposition). Activation annealing, etc., are implemented if necessary to provide ohmic contacts between the electrodes and the semiconductor layer.

Then, all of the exposed portions on the major surface of the substrate 10 are covered with the insulating film 18 shown in FIG. 13A; and subsequently, the first openings 18a and the second opening 18b are made selectively in the insulating film 18 by patterning the insulating film 18 by, for example, wet etching. The first openings 18a are multiply formed; and each of the first openings 18a reaches the p-side electrode 16. The second opening 18b reaches the n-side electrode 17.

An organic material such as, for example, photosensitive polyimide, benzocyclobutene, etc., may be used as the insulating film 18. In such a case, direct exposure and developing of the insulating film 18 are possible without using a resist.

Or, an inorganic film such as a silicon nitride film, a silicon oxide film, etc., may be used as the insulating film 18. In the case where the insulating film 18 is the inorganic film, the first openings 18a and the second opening 18b are made by etching after a resist formed on the insulating film 18 is patterned.

Then, the metal film 19 is formed as shown in FIG. 13B on the surface of the insulating film 18, the inner walls (the side walls and the bottom portions) of the first openings 18a, and the inner wall (the side wall and the bottom portion) of the second opening 18b. The metal film 19 is used as a seed metal of the plating described below.

The metal film 19 is formed by, for example, sputtering. The metal film 19 includes, for example, a stacked film of titanium (Ti) and copper (Cu) stacked in order from the insulating film 18 side. Or, an aluminum film may be used instead of the titanium film.

Then, as shown in FIG. 13C, a resist 91 is formed selectively on the metal film 19; and Cu electroplating is performed using the metal film 19 as a current path.

Figure 14A:
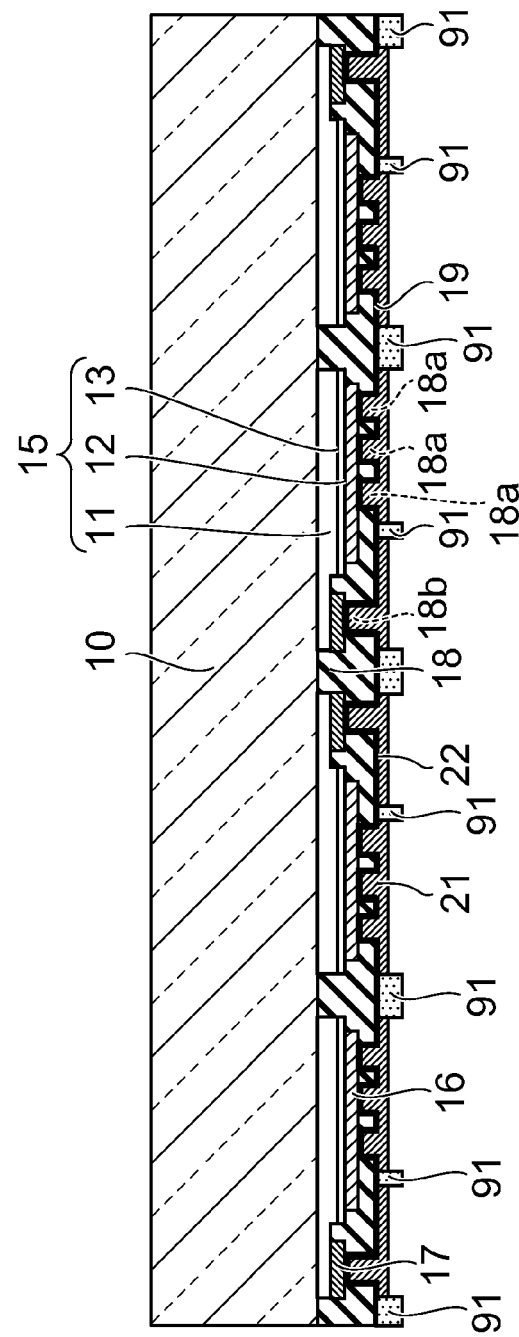
Figure 14B:
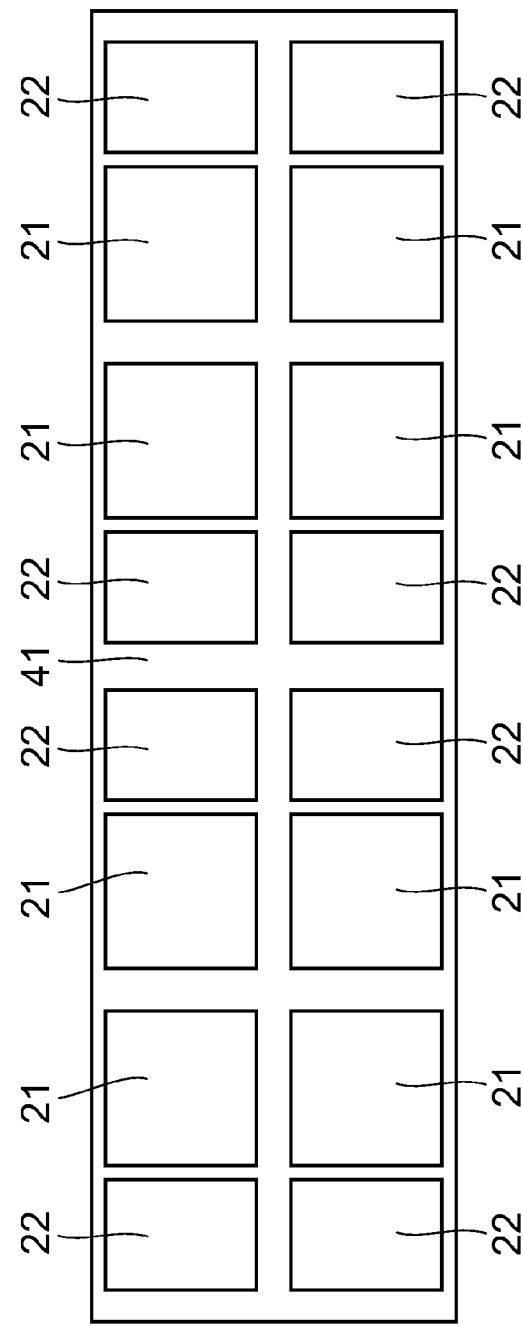

Thereby, as shown in FIG. 14A and FIG. 14B which is the bottom view of FIG. 14A, the p-side interconnect layer 21 and the n-side interconnect layer 22 are formed selectively on the metal film 19. The p-side interconnect layer 21 and the n-side interconnect layer 22 are made of, for example, a copper material formed simultaneously by plating.

The p-side interconnect layer 21 is formed also inside the first openings 18a and is electrically connected to the p-side electrode 16 via the metal film 19. The n-side interconnect layer 22 is formed also inside the second opening 18b and is electrically connected to the n-side electrode 17 via the metal film 19.

The resist 91 used in the plating of the p-side interconnect layer 21 and the n-side interconnect layer 22 is removed using a solvent or oxygen plasma.

Then, as shown in FIG. 15A and FIG. 15B which is the bottom view of FIG. 15A, a resist 92 for forming the metal pillars is formed. The resist 92 is thicker than the resist 91 described above. The resist 91 may remain without being removed in the previous process; and the resist 92 may be formed to overlap the resist 91. A first opening 92a and a second opening 92b are made in the resist 92.

Continuing, Cu electroplating using the metal film 19 as a current path is performed using the resist 92 as a mask. Thereby, the p-type metal pillar 23 and the n-side metal pillar 24 are formed as shown in FIG. 16A and FIG. 16B which is the bottom view of FIG. 16A.

The p-type metal pillar 23 is formed on the surface of the p-side interconnect layer 21 inside the first opening 92a made in the resist 92. The n-side metal pillar 24 is formed on the surface of the n-side interconnect layer 22 inside the second opening 92b made in the resist 92. The p-type metal pillar 23 and the n-side metal pillar 24 are made of, for example, a copper material formed simultaneously by plating.

As shown in FIG. 17A, the resist 92 is removed using, for example, a solvent or oxygen plasma. Subsequently, the exposed portion of the metal film 19 is removed by wet etching using the metal pillar 23, the n-side metal pillar 24, the p-side interconnect layer 21, and the n-side interconnect layer 22 as a mask. Thereby, as shown in FIG. 17B, the electrical connection via the metal film 19 between the p-side interconnect layer 21 and the n-side interconnect layer 22 is broken.

Figure 18A:
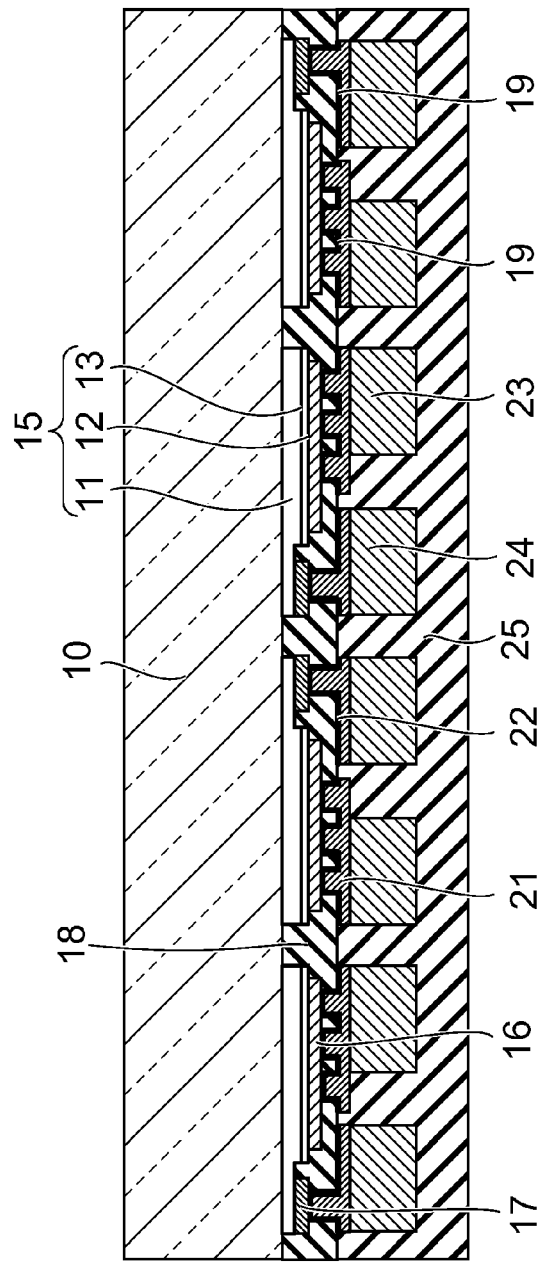

Then, as shown in FIG. 18A, the resin layer 25 is stacked on the insulating film 18. The resin layer 25 covers the p-side interconnect layer 21, the n-side interconnect layer 22, the p-type metal pillar 23, and the n-side metal pillar 24.

The resin layer 25 is insulative. The resin layer 25 may be light-shielding to the light emitted by the light emitting layer 13 by the resin layer 25 containing, for example, carbon black.

Figure 18B:
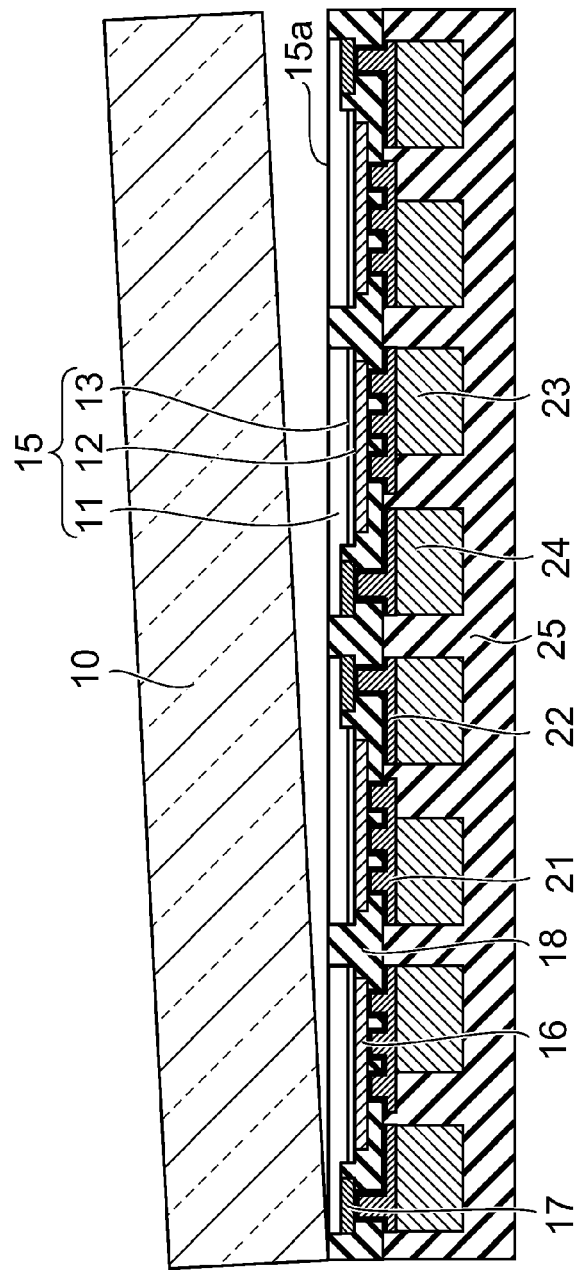

Then, as shown in FIG. 18B, the substrate 10 is removed. In the case where the substrate 10 is the sapphire substrate, the substrate 10 can be removed by, for example, laser lift-off. Specifically, laser light is irradiated from the back surface side of the substrate 10 toward the first semiconductor layer 11. The substrate 10 is transmissive to the laser light; and the laser light has a wavelength in the absorption region of the first semiconductor layer 11.

When the laser light reaches the interface between the substrate 10 and the first semiconductor layer 11, the first semiconductor layer 11 proximal to the interface decomposes by absorbing the energy of the laser light. The first semiconductor layer 11 decomposes into gallium (Ga) and nitrogen gas. A micro gap is made between the substrate 10 and the first semiconductor layer 11 by this decomposition reaction; and the substrate 10 and the first semiconductor layer 11 separate.

The irradiation of the laser light is performed over the entire wafer by performing multiply for every set region; and the substrate 10 is removed.

In the case where the substrate 10 is the silicon substrate, the substrate 10 can be removed by etching.

Because the stacked body described above formed on the major surface of the substrate 10 is reinforced by the p-type metal pillar 23, the n-side metal pillar 24, and the resin layer 25 that are thicker than the semiconductor layer 15, it is possible to maintain the wafer state even in the case where there is no substrate 10.

The resin layer 25 and the metals included in the p-type metal pillar 23 and the n-side metal pillar 24 are materials more flexible than the semiconductor layer 15. The semiconductor layer 15 is supported by such a flexible support body. Therefore, destruction of the semiconductor layer 15 can be avoided even in the case where the large internal stress generated in the epitaxial growth of the semiconductor layer 15 on the substrate 10 is relieved all at once when peeling the substrate 10.

The first surface 15a of the semiconductor layer 15, from which the substrate 10 is removed, is cleaned. The gallium (Ga) adhered to the first surface 15a is removed using, for example, dilute hydrofluoric acid, etc.

Subsequently, wet etching of the first surface 15a is performed using, for example, a KOH (potassium hydroxide) aqueous solution, TMAH (tetramethylammonium hydroxide), etc. Thereby, an unevenness is formed in the first surface 15a as shown in FIG. 19A due to the difference of the etching rates that depend on the crystal plane orientation. Or, the unevenness may be formed in the first surface 15a by performing etching after the patterning using the resist. The light extraction efficiency can be increased by the unevenness being formed in the first surface 15a.

Then, as shown in FIG. 19B, the phosphor layer 30 is formed on the first surface 15a. The phosphor layer 30 is formed also on the insulating film 18 between the mutually-adjacent semiconductor layers 15.

The liquid transparent resin 31 into which the phosphor 32 is dispersed is thermally cured after being supplied onto the first surface 15a by a method such as, for example, printing, potting, molding, compression molding, etc.

Figure 20A:
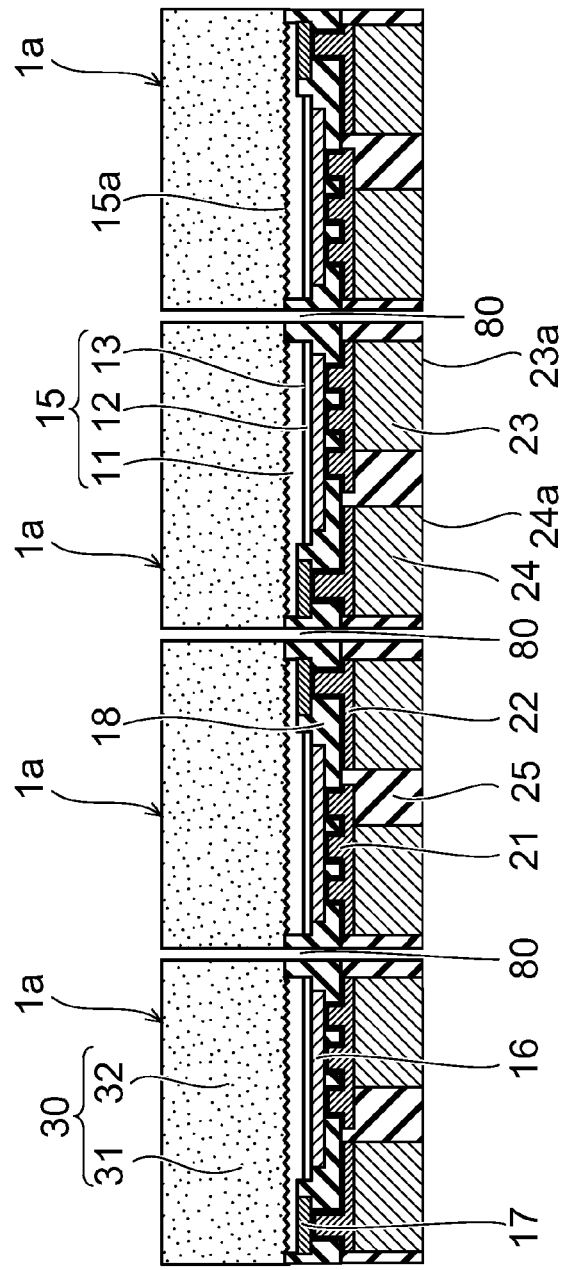
Figure 20B:
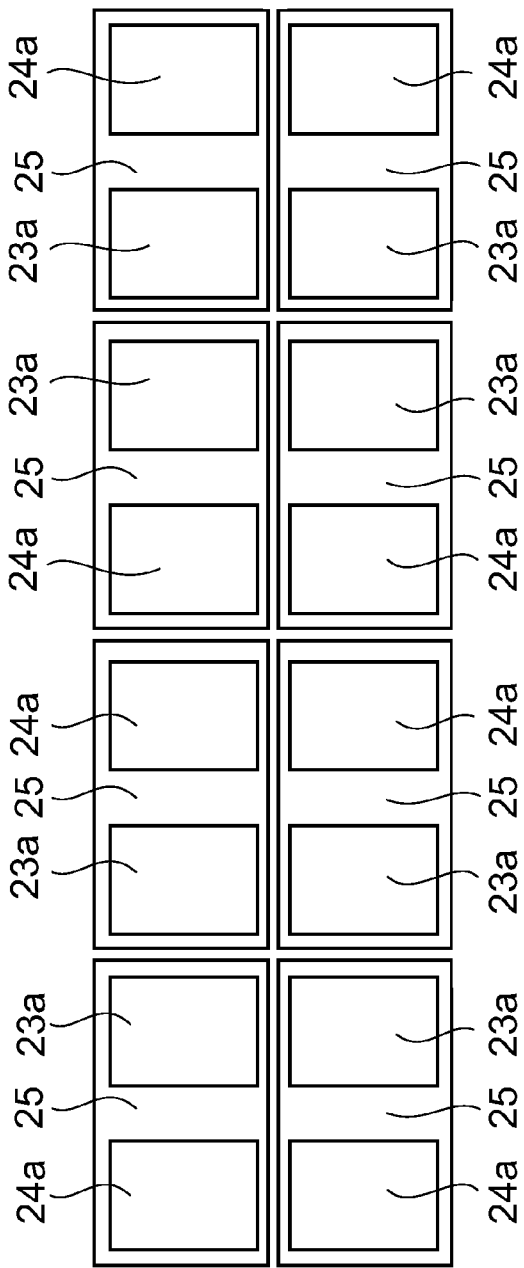

Then, the surface (in FIG. 19B, the lower surface) of the resin layer 25 is polished to expose the p-side electrode surface 23a and the n-side electrode surface 24a as shown in FIG. 20A and FIG. 20B which is the bottom view of FIG. 20A.

Subsequently, singulation into the multiple semiconductor light emitting devices 1a is performed by cutting the phosphor layer 30, the insulating film 18, and the resin layer 25 at the positions of the trench 80 described above. For example, the cutting is performed using a dicing blade. Or, the cutting may be performed using laser irradiation.

The substrate 10 is already removed when dicing. Further, damage to the semiconductor layer 15 when dicing can be avoided because the semiconductor layer 15 does not exist in the trench 80. A structure is obtained in which the end portion (the side surface) of the semiconductor layer 15 is protected by being covered with the insulating film 18 without an additional process after the singulation.

The singulated semiconductor light emitting device 1a may have a single-chip structure including one semiconductor layer 15 or may have a multi-chip structure including multiple semiconductor layers 15.

Because each of the processes described above until the dicing is performed can be performed collectively in the wafer state, it is unnecessary to perform the interconnects and the packaging for every singulated individual device; and it becomes possible to drastically reduce the production costs. In other words, the interconnects and the packaging are already complete in the singulated state. Therefore, the productivity can be increased; and as a result, price reductions become easy.

Figure 7A:
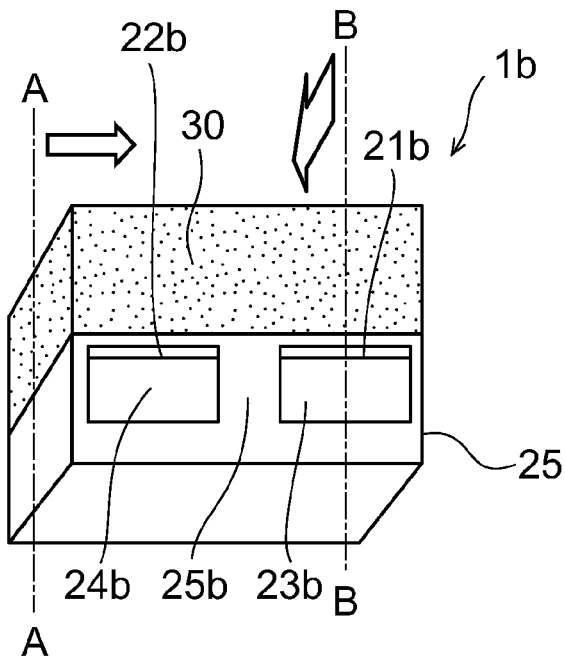
FIGS. 7A to 7C are schematic views of a device of a sixth embodiment.
Figure 7B:
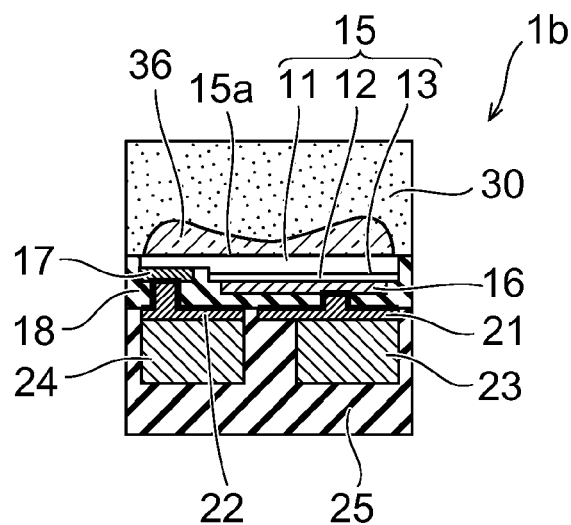
Figure 7C:
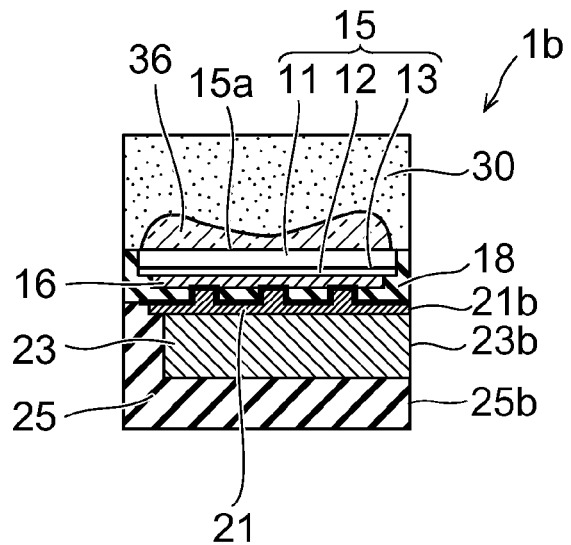

As in a semiconductor light emitting device 1b of FIGS. 7A to 7C, a lens 36 may be provided on the first surface 15a. The lens 36 is not limited to having a recessed configuration and may have a protruding configuration.

Sixth Embodiment

FIG. 7A is a schematic perspective view of a semiconductor light emitting device 1b of a sixth embodiment. FIG. 7B is the A-A cross-sectional view of FIG. 7A. FIG. 7C is the B-B cross-sectional view of FIG. 7A.

As shown in FIGS. 7A and 7C, the side surface of a portion of the p-type metal pillar 23 is exposed from the resin layer 25 at a third surface 25b which has a plane orientation different from those of the first surface 15a and the second surface of the semiconductor layer 15. The exposed surface functions as a p-side electrode surface 23b for mounting to the mounting substrate 70.

The third surface 25b is a surface substantially perpendicular to the first surface 15a and the second surface of the semiconductor layer 15. The resin layer 25 has, for example, four side surfaces having rectangular configurations; and one of the side surfaces is the third surface 25b.

The side surface of a portion of the n-side metal pillar 24 is exposed from the resin layer 25 at the same third surface 25b. The exposed surface functions as an n-side electrode surface 24b for mounting to the mounting substrate 70.

As shown in FIG. 7A, a side surface 21b of a portion of the p-side interconnect layer 21 also is exposed from the resin layer 25 at the third surface 25b and functions as the p-side electrode surface. Similarly, the side surface 22b of a portion of the n-side interconnect layer 22 is exposed from the resin layer 25 at the third surface 25b and functions as the n-side electrode surface.

The portion of the p-type metal pillar 23 other than the p-side electrode surface 23b exposed at the third surface 25b is covered with the resin layer 25. Also, the portion of the n-side metal pillar 24 other than the n-side electrode surface 24b exposed at the third surface 25b is covered with the resin layer 25.

The portion of the p-side interconnect layer 21 other than the side surface 21b exposed at the third surface 25b is covered with the resin layer 25. Further, the portion of the n-side interconnect layer 22 other than the side surface 22b exposed at the third surface 25b is covered with the resin layer 25.

Figure 8B:
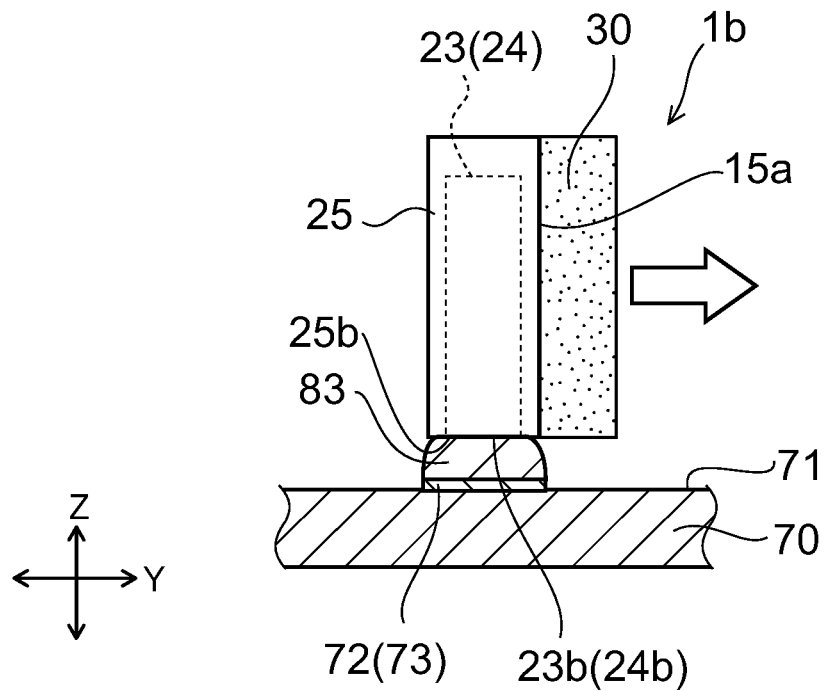
FIG. 8B is a schematic cross-sectional view of a device module in which the device of the sixth embodiment is mounted.

FIG. 8B is a schematic cross-sectional view of a light emitting device module in which the semiconductor light emitting device 1b of the sixth embodiment is mounted on the mounting substrate 70.

The semiconductor light emitting device 1b is mounted with an orientation in which the third surface 25b is oriented toward the mounting surface 71 of the mounting substrate 70. The p-side electrode surface 23b and the n-side electrode surface 24b exposed at the third surface 25b are bonded respectively to the pads 72 and 73 formed in the mounting surface 71 via the solder 83.

A configuration may be used in which the p-side electrode surface 23b and the n-side electrode surface 24b are bonded to the pads 74 and 75 of the second embodiment, the pads 76 and 77 of the third embodiment, or the pads 78 and 79 of the fourth embodiment.

The first surface 15a faces the lateral direction in an orientation in which the semiconductor light emitting device 1b is on the top and the mounting surface 71 is on the bottom. In other words, the optical axis of the semiconductor light emitting device 1b is parallel to the mounting surface 71; and the light is radiated in the lateral direction. In other words, the semiconductor light emitting device 1b is a so-called side-view type light emitting device.

In the case where the side-view type semiconductor light emitting device 1b is mounted on the pads of the first, second, or fourth embodiment described above, the optical axis can be parallel to the mounting surface.

Or, in the case where the semiconductor light emitting device 1b is mounted on the pads of the third embodiment, a light emitting device module can be provided in which the optical axis in the YZ plane shown in FIG. 8B is tilted obliquely upward or obliquely downward with respect to the mounting surface 71.

Seventh Embodiment

Figure 6B:
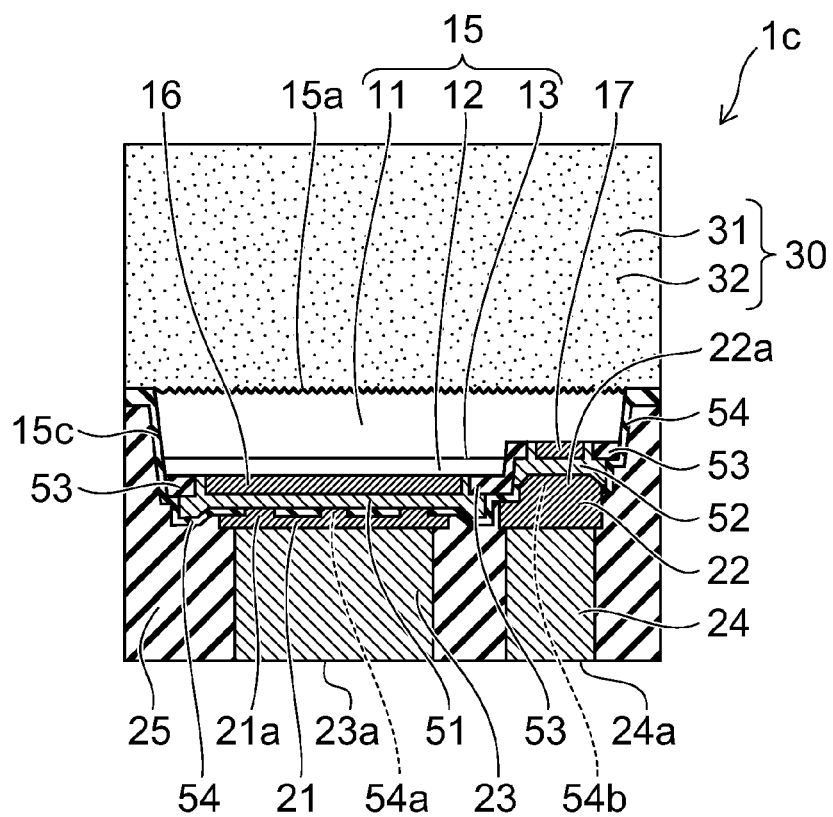
FIG. 6B is a schematic cross-sectional view of a device of a seventh embodiment.

FIG. 6B is a schematic cross-sectional view of a semiconductor light emitting device 1c of a seventh embodiment.

In the semiconductor light emitting device 1c of the seventh embodiment, a p-side pad 51 covering the p-side electrode 16 is provided on the front surface and the side surface of the p-side electrode 16. The p-side electrode 16 includes, for example, at least one selected from nickel (Ni), gold (Au), and rhodium (Rh) that is capable of forming an alloy with the gallium (Ga) included in the semiconductor layer 15. The p-side pad 51 has a reflectance for the light emitted by the light emitting layer 13 that is higher than that of the p-side electrode 16 and includes, for example, silver (Ag) as the main component. The p-side pad 51 protects the p-side electrode 16 from oxidization and/or corrosion.

An n-side pad 52 covering the n-side electrode 17 is provided on the front surface and the side surface of the n-side electrode 17. The n-side electrode 17 includes, for example, at least one selected from nickel (Ni), gold (Au), and rhodium (Rh) that is capable of forming an alloy with the gallium (Ga) included in the semiconductor layer 15. The n-side pad 52 has a reflectance for the light emitted by the light emitting layer 13 that is higher than that of the n-side electrode 17 and includes, for example, silver (Ag) as the main component. Also, the n-side pad 52 protects the n-side electrode 17 from oxidization and/or corrosion.

An insulating film 53 such as, for example, a silicon oxide film, a silicon nitride film, etc., is provided at the periphery of the p-side electrode 16 and the periphery of the n-side electrode 17 at the second surface of the semiconductor layer 15.

The insulating film 53 is provided between the p-side electrode 16 and the n-side electrode 17 and between the p-side pad 51 and the n-side pad 52.

An insulating film 54 such as, for example, a silicon oxide film, a silicon nitride film, etc., is provided on the insulating film 53, on the p-side pad 51, and on the n-side pad 52. The insulating film 54 is provided also on the side surface 15c of the semiconductor layer 15 to cover the side surface 15c.

The p-side interconnect layer 21 and the n-side interconnect layer 22 are provided on the insulating film 54. Multiple first openings 54a are made in the insulating film 54; and the p-side interconnect layer 21 is connected to the p-side pad 51 by means of the first vias 21a provided inside the first openings 54a.

A second opening 54b is made in the insulating film 54; and the n-side interconnect layer 22 is connected to the n-side pad 52 by means of the second via 22a provided inside the second opening 54b.

In this structure as well, the p-side interconnect layer 21 may be connected to the p-side pad 51 by means of the multiple vias 21a as shown in the drawing or may be connected to the p-side pad 51 by means of one via having a planar size that is larger than that of the via 21a.

The p-type metal pillar 23 that is thicker than the p-side interconnect layer 21 is provided on the p-side interconnect layer 21. The n-side metal pillar 24 that is thicker than the n-side interconnect layer 22 is provided on the n-side interconnect layer 22.

The resin layer 25 is stacked on the insulating film 54. The resin layer 25 covers the p-side interconnect unit including the p-side interconnect layer 21 and the p-type metal pillar 23 and the n-side interconnect unit including the n-side interconnect layer 22 and the n-side metal pillar 24.

However, the surface (in the drawing, the lower surface) of the p-type metal pillar 23 on the side opposite to the p-side interconnect layer 21 is exposed from the resin layer 25 and functions as the p-side electrode surface 23a. Similarly, the surface (in the drawing, the lower surface) of the n-side metal pillar 24 on the side opposite to the n-side interconnect layer 22 is exposed from the resin layer 25 and functions as the n-side electrode surface 24a.

Or, the semiconductor light emitting device may be a side-view type semiconductor light emitting device by leaving the side surface of the p-type metal pillar 23 and the side surface of the n-side metal pillar 24 exposed.

The resin layer 25 is filled with the insulating film 54 interposed on the substrate 10 and inside the trench 80 described above that separates the semiconductor layer 15 into a plurality. Accordingly, the side surface 15c of the semiconductor layer 15 is protected by being covered with the insulating film 54 and the resin layer 25 which are inorganic films.

In the semiconductor light emitting device 1c as well, it is possible to suppress the tilt (of the optical axis) of the semiconductor light emitting device 1c and perform the mounting similarly to the embodiment described above by mounting the semiconductor light emitting device 1c on a pad having a first width portion and a second width portion that have different widths in the Y direction or a pair of pads that have different widths in the Y direction.

Or, as in the third embodiment, the semiconductor light emitting device 1c may be mounted on the pads 76 and 77. In such a case, it is possible to mount the semiconductor light emitting device 1c with the optical axis of the semiconductor light emitting device 1c tilted at any angle with respect to the mounting surface 71.

In the semiconductor light emitting device of the embodiment recited above, the p-side interconnect layer 21 and the n-side interconnect layer 22 may function as the electrode surfaces and may be bonded to the pads of the mounting substrate without providing the p-type metal pillar 23 and the n-side metal pillar 24.

The p-side interconnect layer 21 and the p-type metal pillar 23 are not limited to being separate entities; and the p-side interconnect layer 21 and the p-type metal pillar 23 may be included in the p-side interconnect unit by being provided as a single body by the same process. Similarly, the n-side interconnect layer 22 and the n-side metal pillar 24 are not limited to being separate entities; and the n-side interconnect layer 22 and the n-side metal pillar 24 may be included in the n-side interconnect unit by being provided as a single body by the same process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A device module, comprising:
   a mounting substrate having a mounting surface and a plurality of pads provided in the mounting surface, the plurality of pads having a first width portion and a second width portion;
   a device including a plurality of electrode surfaces arranged in a first direction, the device being mounted on the mounting substrate with the electrode surfaces oriented toward the mounting surface, the electrode surfaces having a third width portion in a second direction orthogonal to the first direction; and
   a bonding agent provided between the plurality of pads and the electrode surfaces, the bonding agent being conductive,
   wherein the first width portion has a width in the second direction, and the second width portion is wider than the first width portion and the third width portion in the second direction,
   wherein one end portion in the first direction of the electrode surfaces is bonded to the first width portion of the pads via the bonding agent, and the other end portion in the first direction of the electrode surfaces is bonded to the second width portion of the pads via the bonding agent, and
   wherein a distance in the first direction between the plurality of pads is shorter than a distance in the first direction between the plurality of electrode surfaces.

2. The module according to claim 1, wherein the plurality of pads includes a pair of pads arranged in the first direction with line symmetry.

3. The module according to claim 1, wherein a center position of the first width portion in the second direction is shifted in the second direction from a center position of the second width portion in the second direction.

4. The module according to claim 3, wherein the electrode surfaces are tilted with respect to a surface of the pad.

5. The module according to claim 1, wherein:
   a surface of the bonding agent has a curvature, and
   the curvature of the surface of the bonding agent on the second width portion is smaller than the curvature of the surface of the bonding agent on the first width portion.

6. The module according to claim 1, wherein the device includes:
   a semiconductor layer having a first surface, a second surface opposite to the first surface, and a light emitting layer;
   a p-side electrode provided on the second surface in an emitting region;
   an n-side electrode provided on the second surface in a non-emitting region;
   a first insulating film covering the p-side electrode and the n-side electrode;
   a p-side interconnect unit provided on the first insulating film, the p-side interconnect unit being bonded to the bonding agent and electrically connected to the p-side electrode through a first via piercing the first insulating film; and
   an n-side interconnect unit provided on the first insulating film, the n-side interconnect unit being bonded to the bonding agent and electrically connected to the n-side electrode through a second via piercing the first insulating film.

7. The module according to claim 6, wherein the first insulating film covers a side surface of the semiconductor layer continuing from the first surface.

8. The module according to claim 6, wherein the device further includes a second insulating film provided between the p-side interconnect unit and the n-side interconnect unit.

9. The module according to claim 8, wherein the second insulating film continuously covers a periphery of the p-side interconnect unit and a periphery of the n-side interconnect unit.

10. The module according to claim 6, wherein:
    the p-side interconnect unit includes:
       a p-side interconnect layer provided on the first insulating film; and
       a p-type metal pillar provided on the p-side interconnect layer, the p-type metal pillar being thicker than the p-side interconnect layer, and
    the n-side interconnect unit includes:
       an n-side interconnect layer provided on the first insulating film; and
       an n-side metal pillar provided on the n-side interconnect layer, the n-side metal pillar being thicker than the n-side interconnect layer.

11. The module according to claim 6, wherein the device further includes a phosphor layer provided on the first surface side.

12. The module according to claim 1, wherein the bonding agent is solder configured to melt by heating.

13. The module according to claim 1, wherein each of the plurality of the pads has the first width portion and the second width portion.

14. A device module, comprising:
    a mounting substrate having a mounting surface, a first pad provided in the mounting surface, and a second pad provided in the mounting surface, the first pad having a first width portion at an edge on a side thereof facing the second pad, and the second pad having a second width portion at an edge on a side thereof facing the first pad;
    a device including a first electrode surface and a second electrode surface arranged in a first direction, the device being mounted on the mounting substrate with the first electrode surface and the second electrode surface oriented toward the mounting surface, the first and second electrode surfaces having a third width portion in a second direction orthogonal to the first direction; and a bonding agent provided between the first electrode surface and the first pad and between the second electrode surface and the second pad, the bonding agent being conductive, wherein the first electrode surface is bonded to the first pad via the bonding agent, and the second electrode surface is bonded to the second pad via the bonding agent, and wherein the second width portion is wider than the first width portion and the third width portion in the second direction.

15. The module according to claim 14, wherein the device includes:
- a semiconductor layer having a first surface, a second surface opposite to the first surface, and a light emitting layer;
- a p-side electrode provided on the second surface in an emitting region;
- an n-side electrode provided on the second surface in a non-emitting region;
- a first insulating film covering the p-side electrode and the n-side electrode;
- a p-side interconnect unit provided on the first insulating film, the p-side interconnect unit being bonded to the bonding agent and electrically connected to the n-side electrode through a first via piercing the first insulating film; and
- an n-side interconnect unit provided on the first insulating film, the n-side interconnect unit being bonded to the bonding agent and electrically connected to the n-side electrode through a second via piercing the first insulating film.

16. The module according to claim 15, wherein the first insulating film covers a side surface of the semiconductor layer continuing from the first surface.

17. The module according to claim 15, wherein the device further includes a second insulating film provided between the p-side interconnect unit and the n-side interconnect unit.

18. The module according to claim 17, wherein the second insulating film continuously covers a periphery of the p-side interconnect unit and a periphery of the n-side interconnect unit.

19. The module according to claim 15, wherein:
the p-side interconnect unit includes:
- a p-side interconnect layer provided on the first insulating film; and
- a p-type metal pillar provided on the p-side interconnect layer, the p-type metal pillar being thicker than the p-side interconnect layer, and the n-side interconnect unit includes:
- an n-side interconnect layer provided on the first insulating film; and
- an n-side metal pillar provided on the n-side interconnect layer, the n-side metal pillar being thicker than the n-side interconnect layer.

20. The module according to claim 15, wherein the device further includes a phosphor layer provided on the first surface side.

21. The module according to claim 14, wherein the bonding agent is solder configured to melt by heating.

22. The module according to claim 1, wherein the electrode surfaces have sides parallel to the first direction.

23. The module according to claim 14, wherein the first and second electrode surfaces have sides parallel to the first direction.

* * * * *